US009673054B2

(12) United States Patent
Mariani et al.

(10) Patent No.: US 9,673,054 B2
(45) Date of Patent: Jun. 6, 2017

(54) ARRAY OF GATED DEVICES AND METHODS OF FORMING AN ARRAY OF GATED DEVICES

(71) Applicant: Micron Technology, Inc., Boise, ID (US)

(72) Inventors: Marcello Mariani, Milan (IT); Anna Maria Conti, Milan (IT); Sara Vigano, Monza (IT)

(73) Assignee: Micron Technology, Inc., Boise, ID (US)

( * ) Notice: Subject to any disclaimer, the term of this patent is extended or adjusted under 35 U.S.C. 154(b) by 9 days.

(21) Appl. No.: 14/461,751

(22) Filed: Aug. 18, 2014

(65) Prior Publication Data
US 2016/0049404 A1    Feb. 18, 2016

(51) Int. Cl.
*H01L 21/8249* (2006.01)
*H01L 21/308* (2006.01)
(Continued)

(52) U.S. Cl.
CPC ........ *H01L 21/308* (2013.01); *H01L 21/8249* (2013.01); *H01L 27/1027* (2013.01);
(Continued)

(58) Field of Classification Search
CPC ............... H01L 21/768; H01L 21/8222; H01L 21/823487; H01L 21/8249;
(Continued)

(56) References Cited

U.S. PATENT DOCUMENTS 3,988,771 A    10/1976   Krishna
5,412,598 A     5/1995   Shulman
(Continued)

FOREIGN PATENT DOCUMENTS

JP         2003-030980      1/2003
KR     10-2010-0070835      6/2010
(Continued)

OTHER PUBLICATIONS

U.S. Appl. No. 14/265,168, Apr. 29, 2014, Righetti et al.
(Continued)

*Primary Examiner* — Matthew Landau
*Assistant Examiner* — Grant Withers
(74) *Attorney, Agent, or Firm* — Wells St. John, P.S.

(57) ABSTRACT

An array of gated devices includes a plurality of gated devices arranged in rows and columns and individually including an elevationally inner region, a mid region elevationally outward of the inner region, and an elevationally outer region elevationally outward of the mid region. A plurality of access lines are individually laterally proximate the mid regions along individual of the rows. A plurality of data/sense lines are individually elevationally outward of the access lines and electrically coupled to the outer regions along individual of the columns. A plurality of metal lines individually extends along and between immediately adjacent of the rows elevationally inward of the access lines. The individual metal lines are directly against and electrically coupled to sidewalls of the inner regions of each of immediately adjacent of the rows. The metal lines are electrically isolated from the data/sense lines. Other arrays of gated devices and methods of forming arrays of gated devices are disclosed.

23 Claims, 23 Drawing Sheets

(51) Int. Cl.
*H01L 29/78* (2006.01)
*H01L 29/744* (2006.01)
*H01L 27/102* (2006.01)

(52) U.S. Cl.
CPC ........ *H01L 29/744* (2013.01); *H01L 29/7827* (2013.01); *H01L 27/1022* (2013.01)

(58) Field of Classification Search
CPC ......... H01L 29/66363; H01L 29/66325; H01L 29/66272
See application file for complete search history.

(56) References Cited

U.S. PATENT DOCUMENTS

| | | |
|---|---|---|
| 5,465,249 A | 11/1995 | Cooper, Jr. et al. |
| 5,510,630 A | 4/1996 | Agarwal et al. |
| 5,874,760 A | 2/1999 | Burns, Jr. et al. |
| 5,930,640 A | 7/1999 | Kenney |
| 6,017,778 A | 1/2000 | Pezzani |
| 6,576,944 B2 | 6/2003 | Weis |
| 6,627,924 B2 | 9/2003 | Hsu et al. |
| 6,653,174 B1 | 11/2003 | Cho et al. |
| 6,690,039 B1 | 2/2004 | Nemati et al. |
| 6,713,791 B2 | 3/2004 | Hsu et al. |
| 6,744,094 B2 * | 6/2004 | Forbes ................ G11C 16/0408 257/314 |
| 6,870,202 B2 | 3/2005 | Oka |
| 6,891,205 B1 | 5/2005 | Cho et al. |
| 6,914,286 B2 | 7/2005 | Park |
| 6,934,209 B2 | 8/2005 | Marr |
| 6,958,513 B2 | 10/2005 | Wang |
| 6,965,129 B1 | 11/2005 | Horch et al. |
| 7,015,092 B2 | 3/2006 | Jaiprakash et al. |
| 7,029,956 B2 | 4/2006 | Hsu et al. |
| 7,081,663 B2 | 7/2006 | Bulucea |
| 7,151,024 B1 | 12/2006 | Forbes |
| 7,195,959 B1 | 3/2007 | Plummer et al. |
| 7,304,327 B1 | 12/2007 | Nemati et al. |
| 7,326,969 B1 | 2/2008 | Horch |
| 7,362,609 B2 | 4/2008 | Harrison et al. |
| 7,368,352 B2 * | 5/2008 | Kim .................. H01L 27/10876 257/296 |
| 7,378,325 B2 | 5/2008 | Kaneko et al. |
| 7,440,310 B2 | 10/2008 | Bhattacharyya |
| 7,456,439 B1 | 11/2008 | Horch |
| 7,488,627 B1 | 2/2009 | Nemati et al. |
| 7,786,505 B1 | 8/2010 | Yang et al. |
| 7,816,728 B2 | 10/2010 | Ho et al. |
| 7,897,440 B1 | 3/2011 | Horch |
| 8,102,025 B2 | 1/2012 | Ozeki et al. |
| 8,288,795 B2 | 10/2012 | Tang et al. |
| 8,435,859 B2 | 5/2013 | Housley |
| 8,501,559 B2 | 8/2013 | Tang et al. |
| 8,518,812 B2 | 8/2013 | Mariani et al. |
| 8,519,431 B2 | 8/2013 | Nemati et al. |
| 8,564,034 B2 | 10/2013 | Masuoka et al. |
| 8,598,621 B2 * | 12/2013 | Tang .................. H01L 27/1027 257/115 |
| 2002/0094619 A1 | 7/2002 | Mandelman et al. |
| 2002/0158254 A1 | 10/2002 | Hsu et al. |
| 2004/0159853 A1 | 8/2004 | Nemati et al. |
| 2006/0007333 A1 * | 1/2006 | Horii .................. H01L 27/14656 348/294 |
| 2008/0003774 A1 | 1/2008 | Baek |
| 2008/0124867 A1 | 5/2008 | Brown |
| 2009/0057722 A1 * | 3/2009 | Masuoka ............. H01L 27/092 257/207 |
| 2009/0140290 A1 | 6/2009 | Schulze et al. |
| 2009/0189228 A1 | 7/2009 | Zhang et al. |
| 2010/0197141 A1 | 8/2010 | Tu et al. |
| 2011/0024791 A1 | 2/2011 | Schulze et al. |
| 2011/0223731 A1 | 9/2011 | Chung et al. |
| 2012/0135573 A1 * | 5/2012 | Kim .................. H01L 27/10873 438/270 |
| 2012/0205736 A1 | 8/2012 | Housley |
| 2012/0214285 A1 * | 8/2012 | Guha ................ H01L 29/66666 438/270 |
| 2012/0223369 A1 | 9/2012 | Gupta et al. |
| 2012/0228629 A1 | 9/2012 | Nemati et al. |
| 2014/0106554 A1 | 4/2014 | Pozzi et al. |
| 2014/0145238 A1 * | 5/2014 | Mariani ............ H01L 29/66363 257/107 |

FOREIGN PATENT DOCUMENTS

| | | |
|---|---|---|
| WO | PCT/US2012/021438 | 8/2012 |
| WO | PCT/US2012/025109 | 9/2012 |
| WO | PCT/US2012/021438 | 8/2013 |
| WO | PCT/US2012/025109 | 9/2013 |

OTHER PUBLICATIONS

U.S. Appl. No. 14/461,689, Oct. 18, 2014, Mariani et al.
U.S. Appl. No. 14/461,730, Oct. 18, 2014, Zanderigo et al.
Burke et al., "Silicon Carbide Thyristors for Power Applications", Pulsed Power Conference 1995, Digest of Technical Papers, 10th IEEE International vol. 1, United States, pp. 327-335.
Cheong et al., "Investigation of Ultralow Leakage in MOS Capacitors on 4H SiC", IEEE Transactions on Electron Devices, vol. 51(9), Sep. 2004, pp. 1361-1365.
Cho et al., A Novel Capacitor-Less DRAM Cell Using Thin Capacitively-Coupled Thyristor (TCCT), IEEE, 2005, 4 pages.
Dimitraiadis etal., "New a-SiC, Optically Controlled, Thyristor-Like Switch", Electronics Letters, vol. 28)17), Aug. 13, 1992, pp. 1622-1624.
Jen et al., "Electrical and Luminescent Characteristics a-SiC:H P-I-:" Thin-Film LED's with Graded-Gap Junctions, IEEE Transactions on Electron Devices, vol. 44(4), Apr. 1997, pp. 565-571.
Nemati et al., A Novel High Density, Low Voltage SRAM Cell with a Vertical NDR Device, IEEE, 1998, 2 pages.
Powell et al., "SiC Materials-Progress, Status, and Potential Roadblocks", Proceedings of the IEEE, vol. 90(6), Jun. 2002, pp. 942-955.
Sasago et al., "Cross-point phase change memory with 4F2 cell size driven by low-contact-resistivity poly-Si diode", Symposium on VLSI Technology Digest of Technical Papers, 2009, pp. 24-25.
Sugizaki et al., "35-nm Gate-Length and Ultra Low-voltage (0.45 V) Operation Bulk Thyristor-SRAM/DRAM (BT-RAM) Cell with Triple Selective Epitaxy Layers (TELs)", Symposium on VLSI Technology Digest of Technical Papers, 2008.
Suliman et al., Gate-Oxide Grown on the Sidewalls and Base of aU-Shaped Si Trench: Effects of the Oxide and Oxide/Si Interface Condition on the Properties of Vertical MOS Devices, Microelectronic Engineering, vol. 72, pp. 247-252; 2004.
Tzeng et al., "Dry Etching of Silicon Materials in SF6 Based Plasmas", J. Electrochem. Soc., 1987 vol. 134, issue 9, pp. 2304-2309.
Xie et al., "A Veritically Integrated Bipolar Storage Cell in 6H Silicon Carbide for Nonvolatile Memory Applications", IEEE Electron Device Letters, vol. 15(6), Jun. 1994, pp. 212-214.
Yang et al., High Performance CMOS Fabricated on Hybrid Substrate with Different Crystal Orientations, IEEE, 2003, 4 pages.
Yu et al., Low-Temperature Titanium-Based Wafer Bonding, Journal of the Electrocheical Society, vol. 154, No. 1, 2007, pp. H20-H25.

* cited by examiner

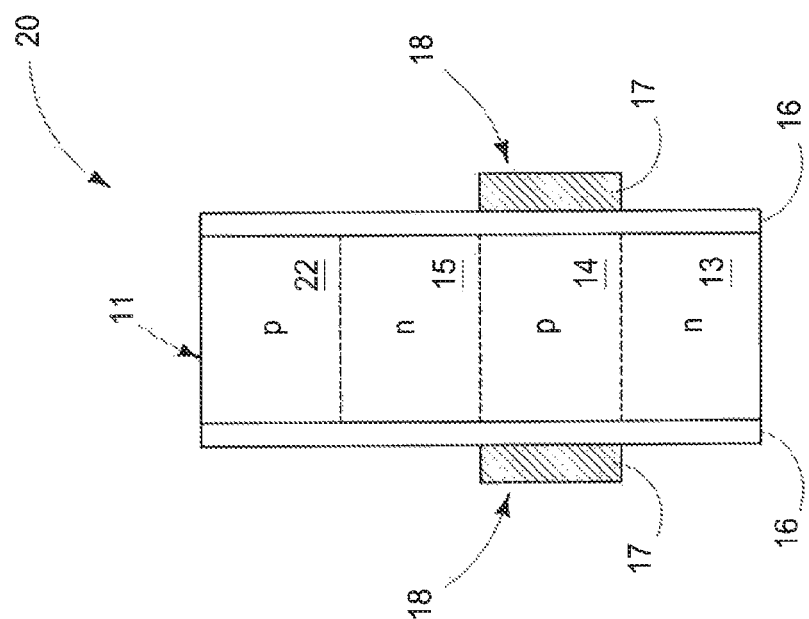
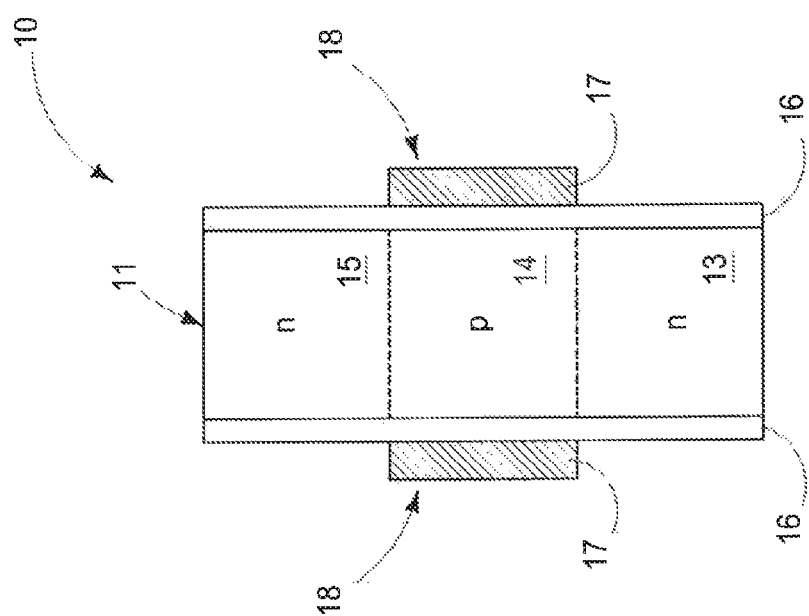

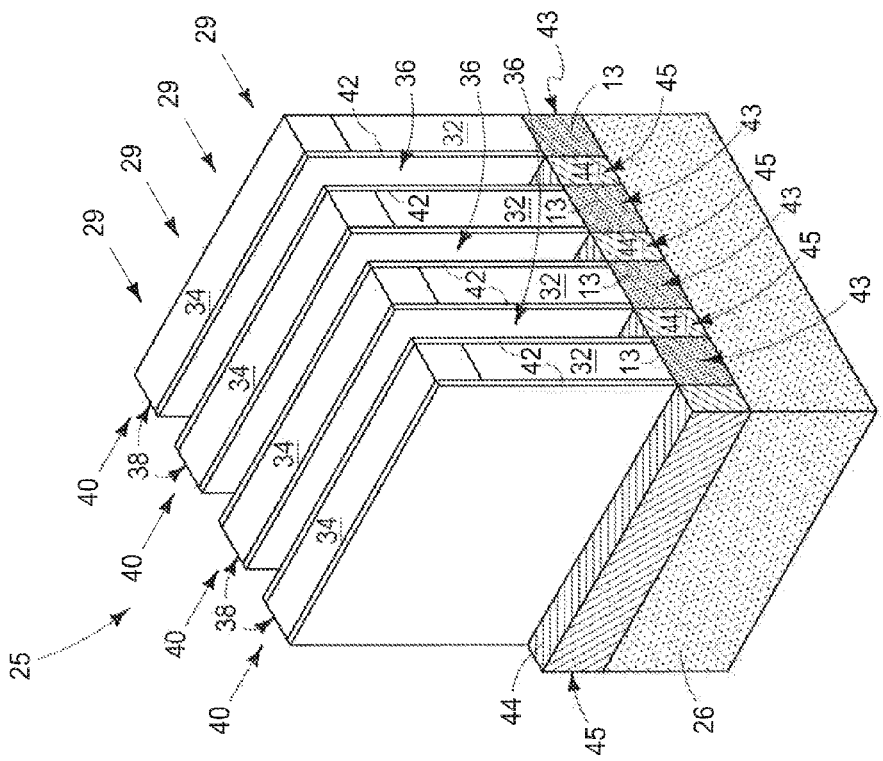
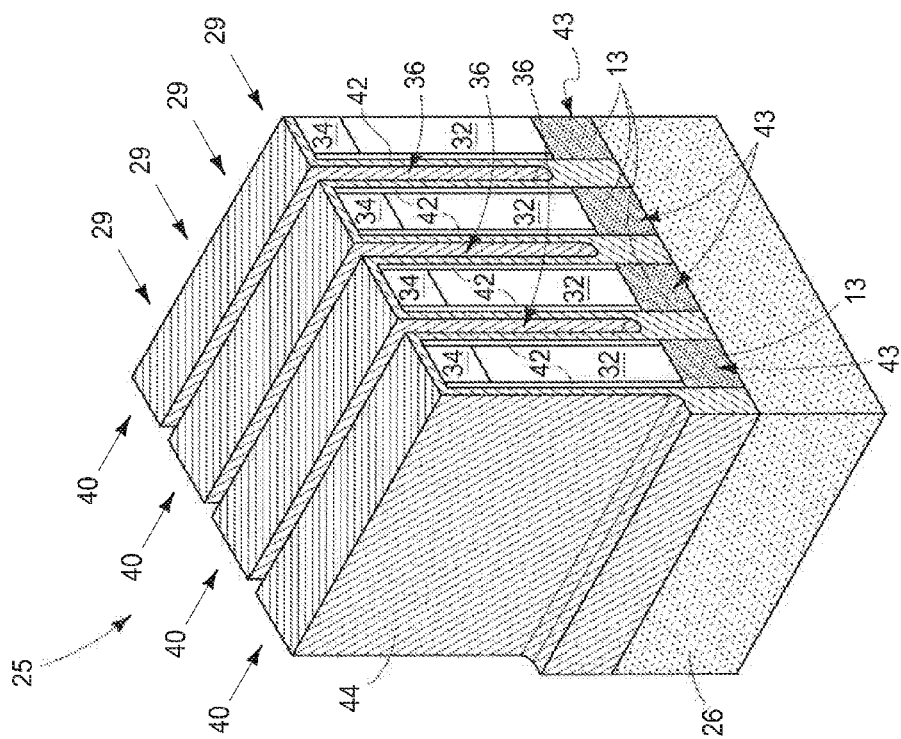

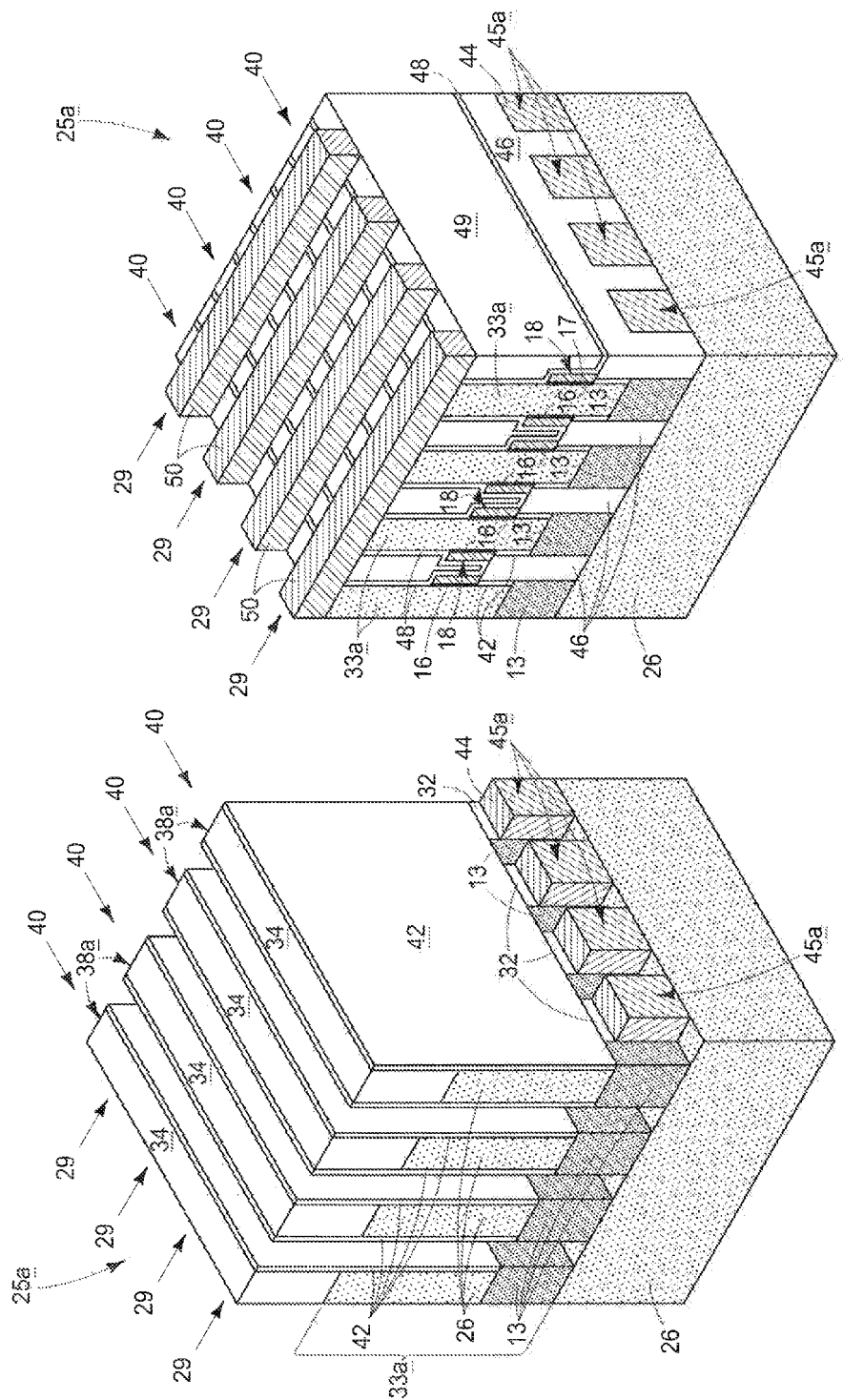

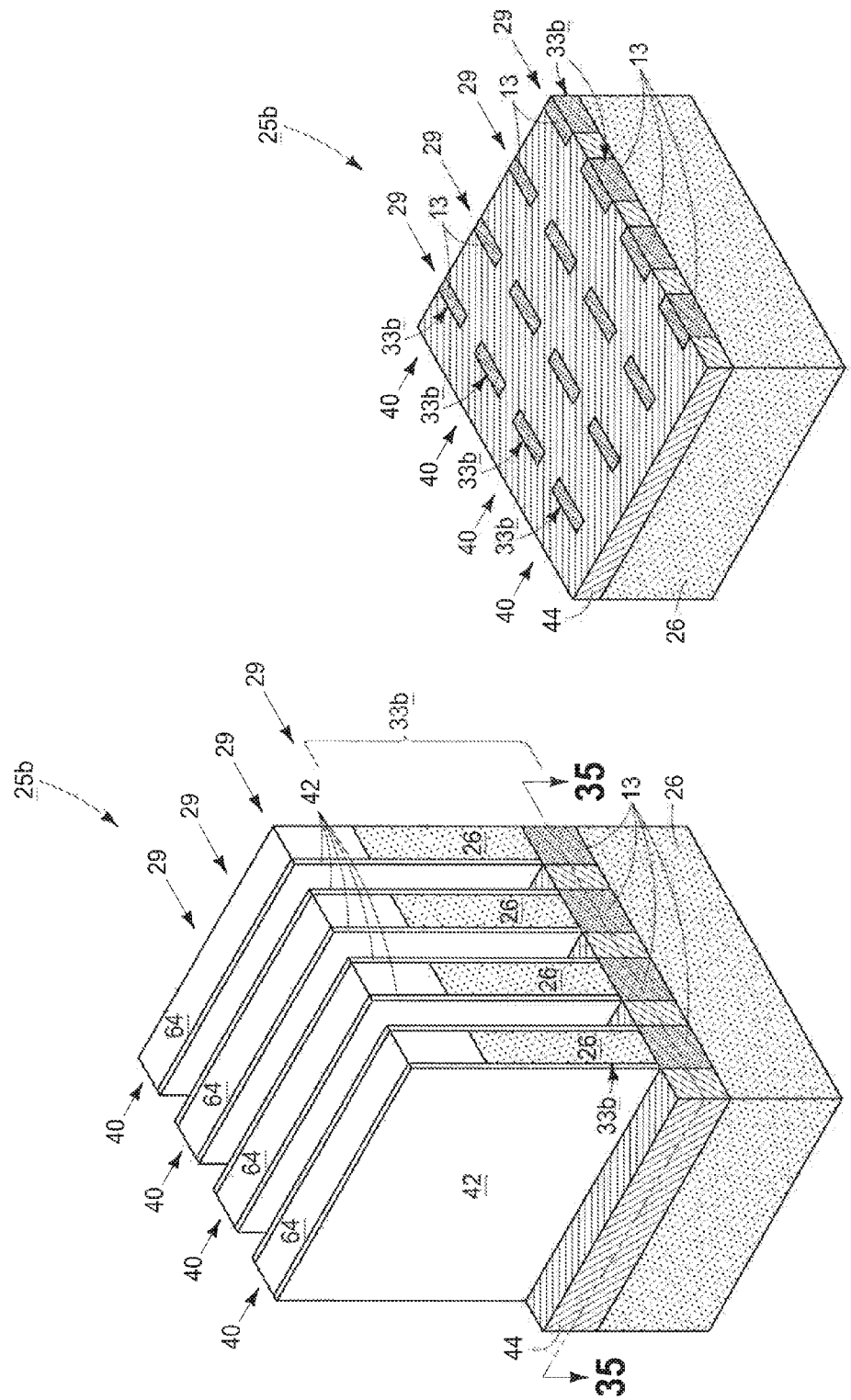

ARRAY OF GATED DEVICES AND METHODS OF FORMING AN ARRAY OF GATED DEVICES

TECHNICAL FIELD

Embodiments disclosed herein pertain to arrays of gated devices and to methods of forming arrays of gated devices.

BACKGROUND

Memory is one type of integrated circuitry, and is used in computer systems for storing data. Memory may be fabricated in one or more arrays of individual memory cells. Memory cells may be written to, or read from, using digit lines (which may also be referred to as bit lines, data lines, sense lines, or data/sense lines) and access lines (which may also be referred to as word lines). The data/sense lines may conductively interconnect memory cells along columns of the array, and the access lines may conductively interconnect memory cells along rows of the array. Each memory cell may be uniquely addressed through the combination of a data/sense line and an access line.

Memory cells may be volatile, semi-volatile, or non-volatile. Non-volatile memory cells can store data for extended periods of time in the absence of power. Nonvolatile memory is conventionally specified to be memory having a retention time of at least about 10 years. Volatile memory dissipates and therefore requires being refreshed/rewritten to maintain data storage. Volatile memory may have a retention time of milliseconds, or less. The memory cells are configured to retain or store memory in at least two different selectable states. In a binary system, the states are considered as either a "0" or a "1". In other systems, at least some individual memory cells may be configured to store more than two levels or states of information.

Gated devices may be used in memory and other integrated circuitry. Example gated devices are field effect transistors (FETs), gated bipolar junction transistors (BJTs), and thyristors. The processing used in fabricating gated devices can be complex. Such complexities can be problematic in semiconductor fabrication processes in that they may increase costs, reduce throughput, and create risks of misalignment or other errors. Accordingly, it is desired to develop new methods of fabricating gated devices.

BRIEF DESCRIPTION OF THE DRAWINGS

FIG. 1 is a diagrammatic vertical section view of a gated device that may be encompassed in embodiments of the invention.

FIG. 2 is a diagrammatic vertical section view of a gated device that may be encompassed in embodiments of the invention.

FIGS. 3-15 are diagrammatic sequential isometric views of a substrate in process in accordance with some embodiments of the invention.

FIGS. 16-23 are diagrammatic sequential isometric views of a substrate in process in accordance with some embodiments of the invention.

FIGS. 24-30, 32-34, and 36 are diagrammatic sequential isometric views of a substrate in process in accordance with some embodiments of the invention. FIG. 35 is an isometric sectional view through line 35-35 in FIG. 34.

DETAILED DESCRIPTION OF EXAMPLE EMBODIMENTS

Figure 4:
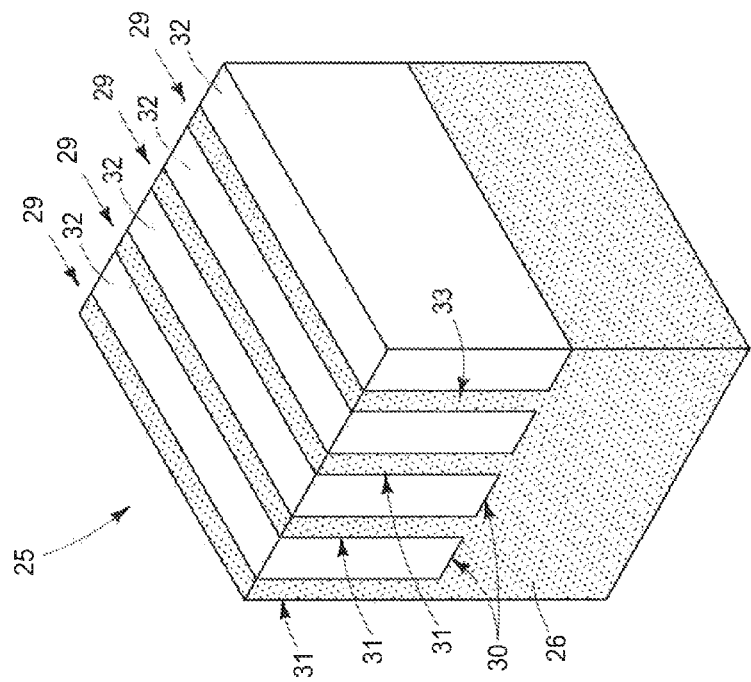

Embodiments of the invention encompass methods of forming an array of gated devices as well as an array of gated devices independent of method of manufacture. Two example gated devices are shown in FIGS. 1 and 2, with FIG. 1 showing a gated transistor 10 and FIG. 2 showing a thyristor 20.

Transistor 10 of FIG. 1 comprises semiconductor material 11 having three doped regions 13, 14, and 15 therein (dashed lines being used to show approximate interfaces of such regions). Any suitable semiconductive material may be used, with monocrystalline and/or polycrystalline silicon being examples. Any of the materials and/or structures described herein may be homogenous or non-homogenous, and regardless may be continuous or discontinuous over any material that such overlie. As used herein, "different composition" only requires those portions of two stated materials that may be directly against one another to be chemically and/or physically different, for example if such materials are not homogenous. If the two stated materials are not directly against one another, "different composition" only requires that those portions of the two stated materials that are closest to one another be chemically and/or physically different if such materials are not homogenous. In this document, a material or structure is "directly against" another when there is at least some physical touching contact of the stated materials or structures relative one another. In contrast, "over", "on", and "against" not preceded by "directly", encompass "directly against" as well as construction where intervening material(s) or structure(s) result(s) in no physical touching contact of the stated materials or structures relative one another. Further, unless otherwise stated, each material may be formed using any suitable existing or yet-to-be-developed technique, with atomic layer deposition, chemical vapor deposition, physical vapor deposition, epitaxial growth, diffusion doping, and ion implanting being examples.

Region 13 comprises an elevationally inner region. Region 14 comprises a mid region elevationally outward of inner region 13. Region 15 comprises an elevationally outer region elevationally outward of mid region 14. In this document, "upper", "lower", "elevational", "top", and "bottom" are with reference to the vertical direction. "Horizontal" refers to a general direction along a primary surface relative to which the substrate is processed during fabrication, and vertical is a direction generally orthogonal thereto. Further, "vertical" and "horizontal" as used herein are generally perpendicular directions relative one another and independent of orientation of the substrate in three-dimensional space. Regions 13, 14, and 15 are shown as being n-type, p-type and n-type, respectively, such that device 10 is an NPN device. As an alternate example, the conductivity types of regions 13, 14, and 15 may be reversed such that the device is a PNP device. A gate dielectric 16 is along sidewalls of semiconductor material 11, and conductive (i.e., electrically) gate material 17 is over gate dielectric 16 operatively laterally proximate mid region 14. Gate material 17 forms or comprises part of access lines 18 that may extend into and out of the page relative to the cross-section of FIG. 1. Although there appears to be two separate access lines 18 on opposing sides of semiconductor material 11, in practice such access lines may be electrically coupled to one another in a location outside of the page so that they are part of a single continuous gate line. In the context of this document, devices or components are electrically coupled relative one another if in normal operation electric current is capable of continuously flowing from one to the other, and does so predominately by movement of subatomic positive and/or negative charges when such are sufficiently generated as opposed to predominately by movement of ions. Access lines 18 may extend only along two opposing sides of semiconductor material 11, or may wrap entirely around semiconductor material 11 for example where material 11 is in the shape of a pillar. As an alternate example, an access line 18 may be on only one side (not shown) of semiconductor material 11. Further, gate dielectric 16 is shown as extending elevationally outward and elevationally inward of access lines 18, although such is not required. As examples, transistor 10 may be a FET or a BJT.

In FIG. 2 with respect to thyristor 20, like numerals from FIG. 1 have been used where appropriate, with a construction difference being indicated with a different numeral. Thyristor 20 comprises semiconductor material 11 having four doped regions 13, 14, 15, and 22, with region 22 being elevationally outward of outer region 15. In the depicted embodiment, regions 13, 14, 15, and 22 are n-type, p-type, n-type, and p-type, respectively, such that device 20 is an NPNP device. As another example, such conductivity types may be reversed whereby the device is a PNPN device.

FIGS. 1 and 2 show but two example gated devices 10 and 20 that may be encompassed in embodiments of the invention. However, other gated devices, whether existing or yet-to-be-developed, may be used.

Figure 3:
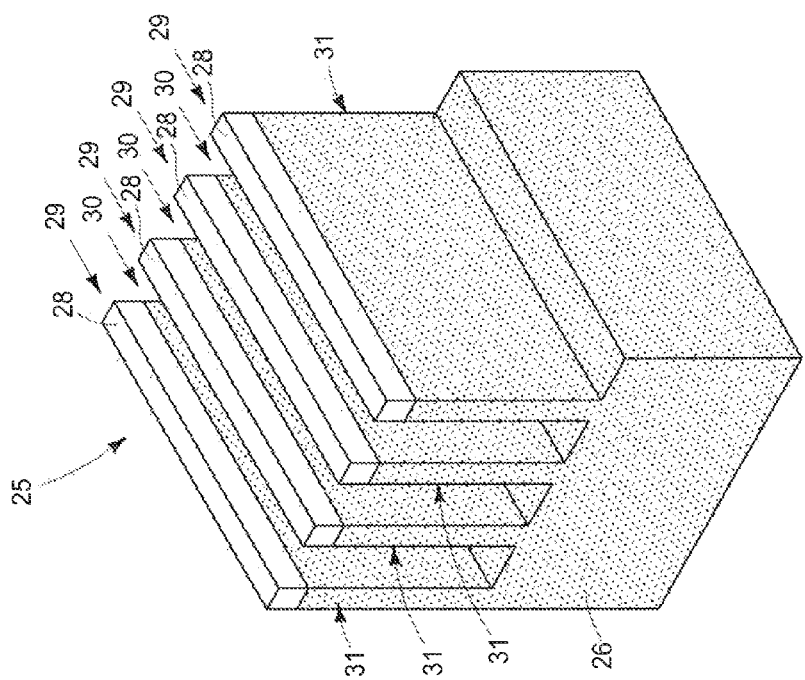

Example methods of forming an array of gated devices in accordance with embodiments of the invention are shown and described with reference to FIGS. 3-44. Like numerals from the above-described embodiments have been used where appropriate, with some construction differences being shown with letter suffixes or with different numerals. A first-such embodiment is shown in FIGS. 3-15. FIG. 3 shows a fragment of a semiconductor substrate 25 comprising semiconductor material 26. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Example semiconductor material 26 is doped or undoped monocrystalline and/or polycrystalline silicon.

Masking material 28 has been patterned over semiconductor material 26 and unmasked portions of semiconductor material 26 have been removed elevationally inward (e.g., by anisotropic etching), thereby forming trenches 30 and walls 31. An example masking material 28 is one or a combination of silicon nitride and silicon dioxide. The array of gated devices being formed will be arranged in rows and columns, with walls 31 in the FIG. 3 example extending along columns 29. Use of "row" and "column" in this document is for convenience in distinguishing one series or orientation of lines from another series or orientation of lines and along which devices have been or will be formed. "Row" and "column" are used synonymously with respect to any series of devices, components, and/or features independent of function. Regardless, the rows may be straight and/or curved and/or parallel and/or not parallel relative one another, as may be the columns. Further, the rows and columns may intersect relative one another at 90° or at one or more other angles.

Referring to FIG. 4, trenches 30 have been filled with dielectric material 32 (e.g., silicon dioxide and/or silicon nitride), followed by planarization back through masking material 28 (not shown) to expose semiconductor material 26. Such may be conducted, by way of example, by one or both of chemical mechanical polishing and etching.

Figure 5:
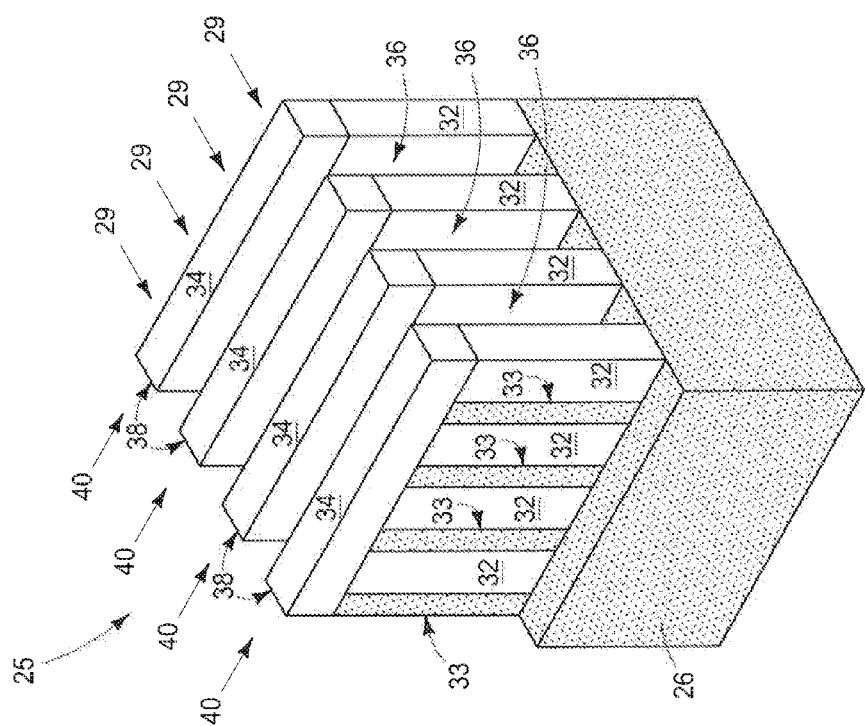

Referring to FIG. 5, masking material 34 (e.g., silicon dioxide and/or silicon nitride) has been deposited and patterned along rows 40, followed by etching into materials 26 and 32 thereby forming trenches 36 between walls 38 that longitudinally extend along rows 40. Pillars 33 of material 26 have also thereby been formed.

Figure 6:
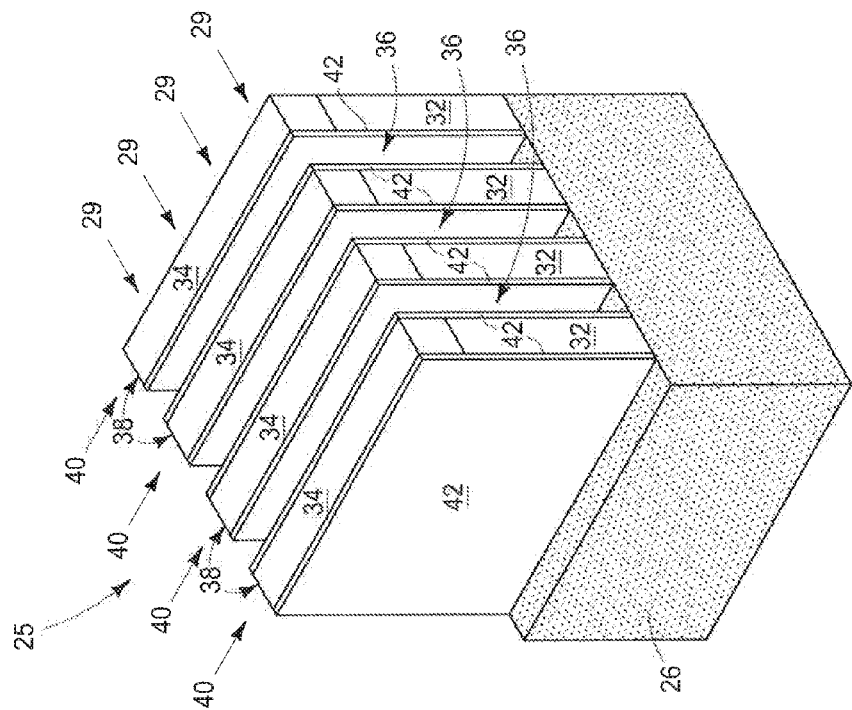

Referring to FIG. 6, a thin dielectric material 42 (e.g., silicon dioxide and/or silicon nitride) has been deposited and anisotropically etched back to substantially remove such from being over horizontal surfaces. In one embodiment, materials 42 and 34 are of the same composition and material 32 is of different composition from that of materials 42 and 34. Material 42 may be provided, for example, to prevent subsequent spurious pillar implantation.

Figure 7:
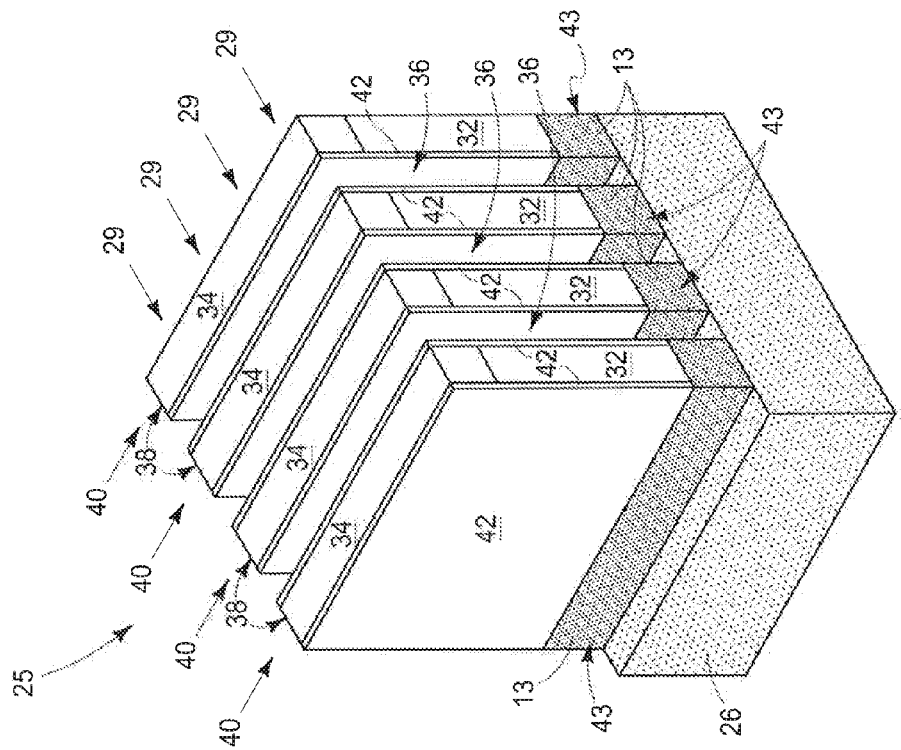

Referring to FIG. 7, ion implantation and diffusion have been conducted into and through the bottoms of trenches 36 thereby at least partially forming inner regions (e.g., 13) of different gated devices. Pillars 33 (not viewable in FIG. 7) are ultimately formed to individually comprise an elevational mid region (e.g., 14) and an elevationally outer region (e.g., 15 or 22) of individual gated devices, such as devices 10 or 20 as shown in FIGS. 1 and 2. Desired dopant type(s) and concentration(s) for the mid regions and the outer regions may be formed at any suitable time and in any order, ideally some time after formation of pillars 33, and are not specifically shown in the figures.

Figure 8:
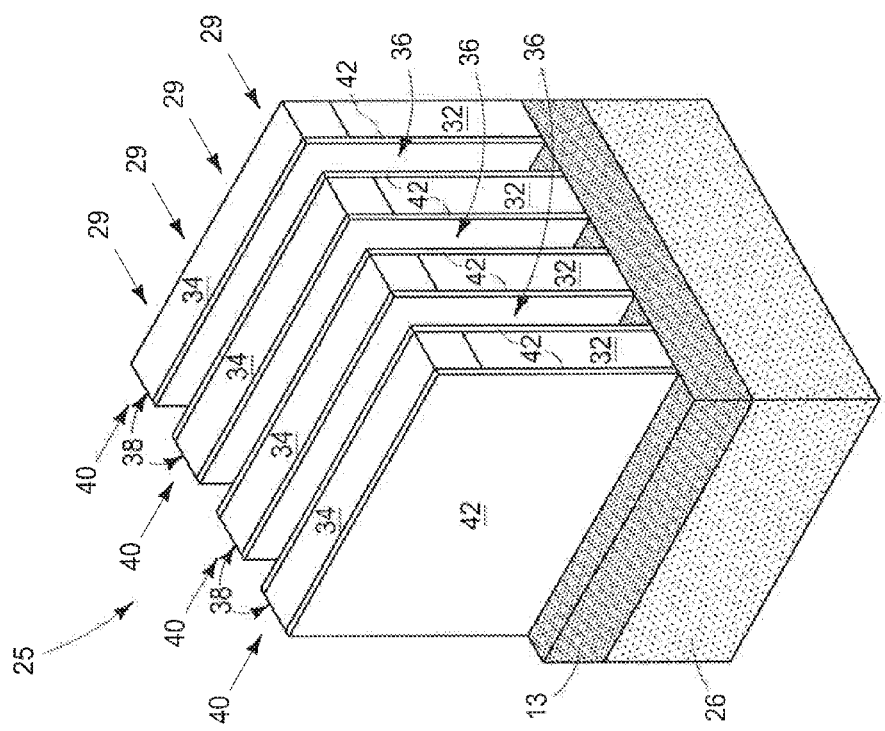

Referring to FIG. 8, walls 38 comprising materials 34, 32, and 42 have been used as a mask while etching through material of inner regions 13 to form lines 43 there-from. Such etching may be conducted selectively relative to materials 34 and 42. In this document, a selective etch is an etch where one material is removed relative to another stated material at a rate of at least 1.5:1.

Referring to FIG. 9, metal 44 has been deposited to completely fill the bottoms of trenches 36 and to line lateral surfaces of and less-than-fill an elevationally outermost region of trenches 36. In this document, "metal" is one or more of a conductive elemental metal, an alloy or mixture of two or more conductive elemental metals, and one or more conductive metal compounds. Examples include tungsten, titanium, titanium nitride, and tantalum nitride.

Referring to FIG. 10, metal 44 that less-than-fills the elevationally outermost regions of trenches 36 has been removed (e.g., by wet or dry etching), thereby forming metal lines 45.

The above-described processing is but one example technique of forming metal lines (e.g., 45) within bottoms of trenches (e.g., 36) between walls (e.g., 38) that longitudinally extend along one of rows (e.g., 40) or columns (e.g., 29). In the embodiment of FIG. 10, metal lines 45 and walls 38 longitudinally extend along rows 40. Another example is described below whereby the walls and metal lines longitudinally extend along the columns. Regardless, alternate methods of forming metal lines within bottoms of trenches between walls that longitudinally extend along one of rows or columns may be used.

Figure 11:
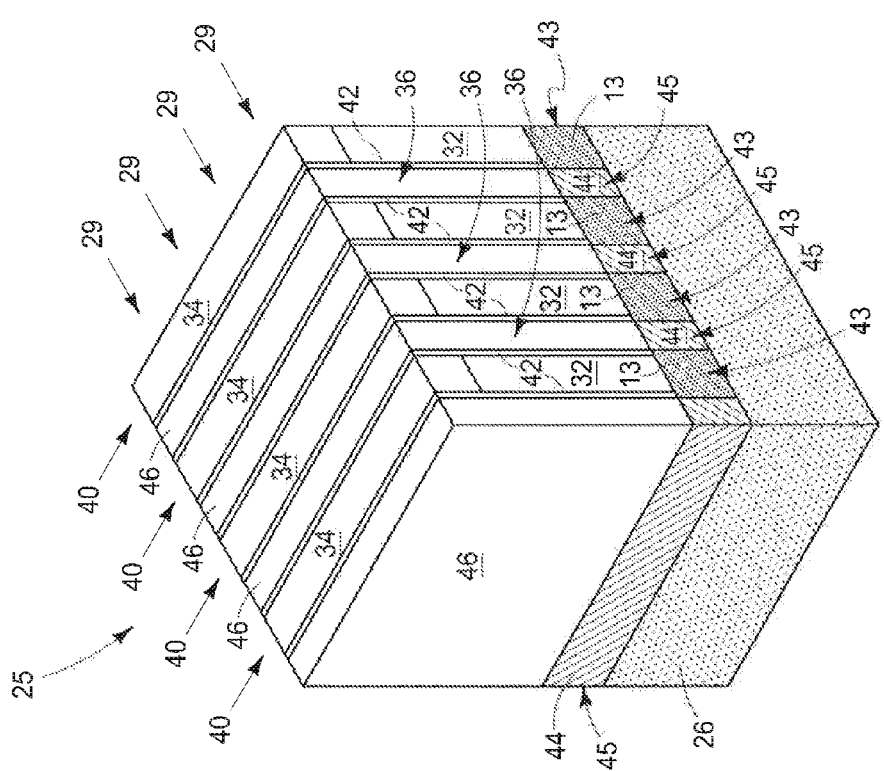

Referring to FIG. 11, remaining volume of trenches 36 has been filled with dielectric material 46 (e.g., silicon dioxide and/or silicon nitride), and which has been subsequently planarized back as shown. In one embodiment, materials 32 and 46 are of the same composition relative one another.

Figure 12:
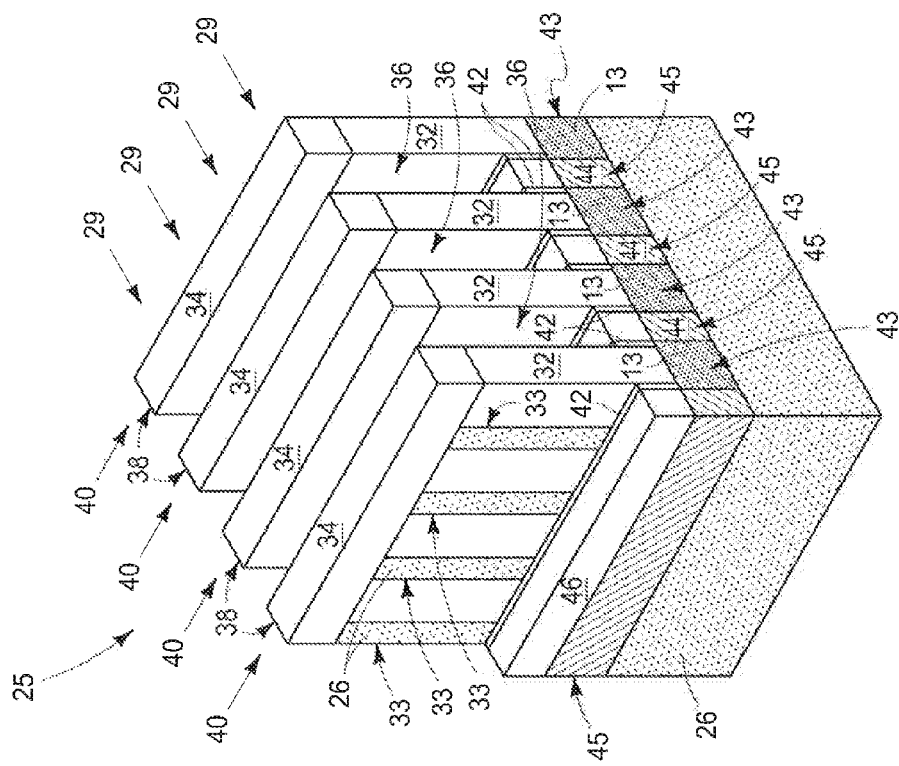

Referring to FIG. 12, materials 46 and 42 have been removed back (e.g., by wet and/or dry etching) to expose sidewalls of pillars 33.

Figure 13:
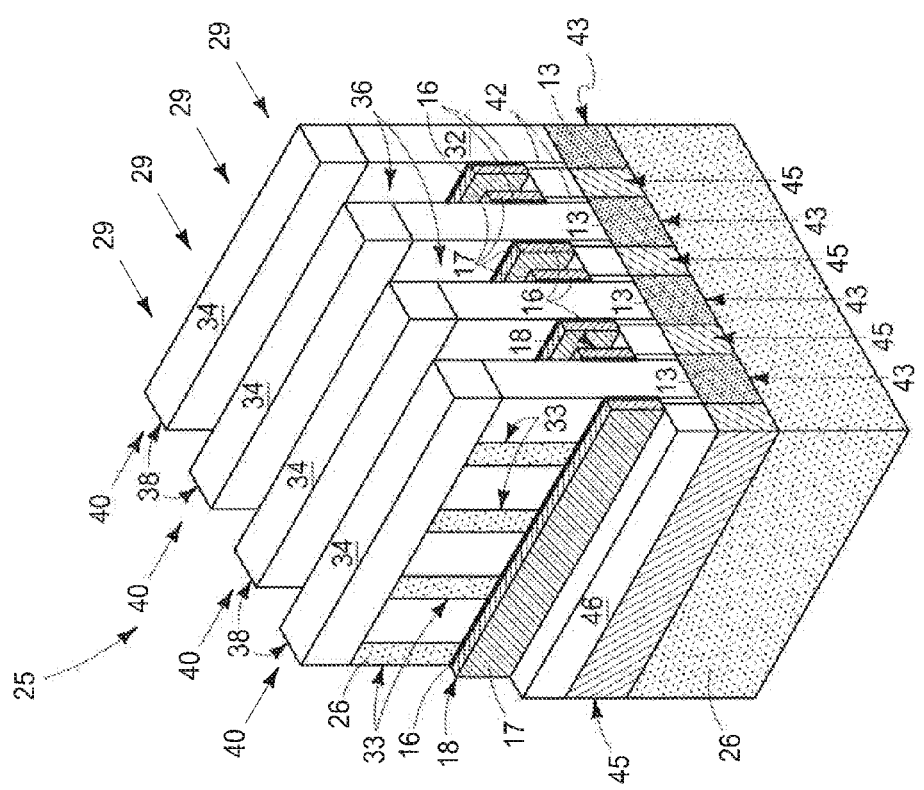

Referring to FIG. 13, a plurality of access lines 18 has been formed elevationally outward of metal lines 45 and that individually are laterally proximate mid regions (not viewable in FIG. 13) of pillars 33 along individual of rows 40. Gate dielectric 16 is laterally between pillars 33 and gate material 17 of access lines 18. Gate dielectric 16 is shown as a solid dark line in FIGS. 13+ for clarity, and may extend all along (not shown) sidewalls of pillars 33. Access lines 18 and gate dielectric 16 may be formed, for example, by conformal depositions of gate dielectric 16 and material 17 over the tops and sides of walls 38 followed by anisotropic etching at least to remove gate material 17 from substantially being over horizontal surfaces and to be recessed elevationally inward as shown. Gate dielectric 16 may be removed from over horizontal surfaces (as shown) or may not be so removed (not shown).

Figure 14:
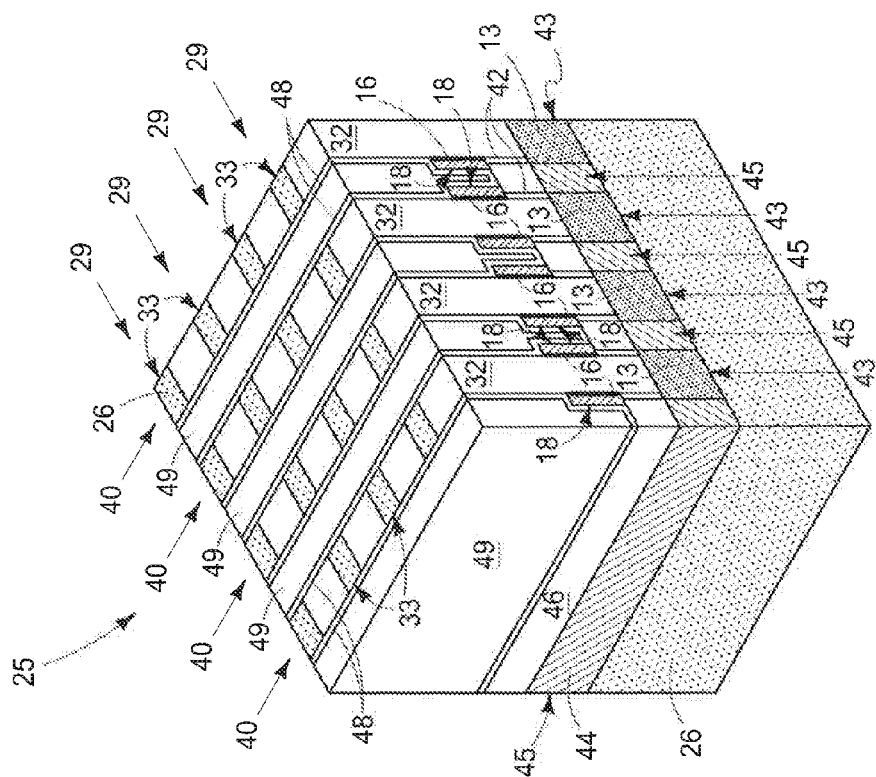

Referring to FIG. 14, dielectric material 48 (e.g., silicon nitride) and dielectric material 49 (e.g., silicon dioxide) have been deposited and planarized back, including through material 34 (not shown), to expose the semiconductor material of pillars 33. Elevationally outermost portions of pillars 33 may comprise outer region 15 of construction 10 in FIG. 1 or outer region 22 of construction 20 in FIG. 2, by way of examples.

Figure 15:
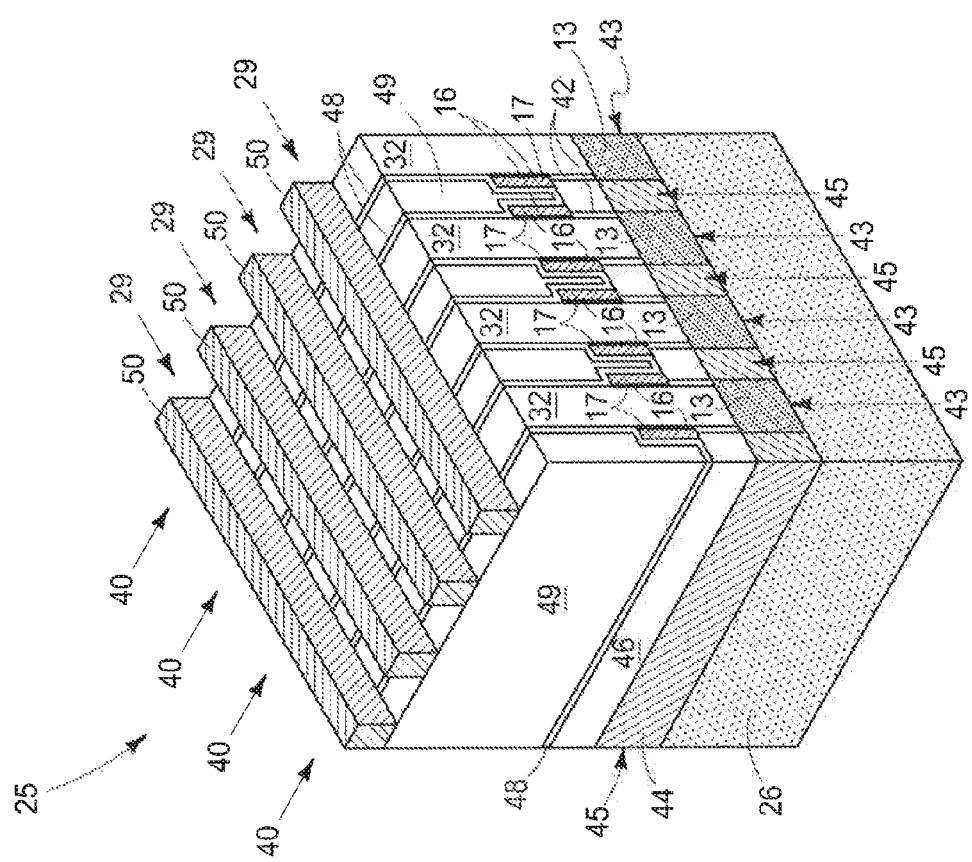

Referring to FIG. 15, a plurality of conductive data/sense lines 50 has been formed elevationally outward of access lines 18, with lines 50 individually electrically coupling to the outer regions of pillars 33 (not viewable in FIG. 15) along individual columns 29.

In a finished circuitry construction, metal lines 45 have been formed to individually longitudinally extend along and between immediately adjacent the one of rows 40 or columns 29 and are directly against and electrically coupled to sidewalls of inner regions 13 of each of immediately adjacent of the rows or columns. Additionally, metal lines 45 are electrically isolated from data/sense lines 50 (i.e., they are not electrically coupled with or to data/sense lines 50). In one embodiment and as shown, inner regions 13 have been formed in lines 43 that longitudinally run under and between pillars 33 between immediately adjacent metal lines 45 (e.g., FIG. 12). In one embodiment and as shown, metal lines 45 and inner region lines 43 longitudinally extend along rows 40. In one embodiment and as shown, metal lines 45 are formed to be laterally narrower than inner region lines 43. In one embodiment, the forming of inner region lines 43 comprises forming a blanketing region of conductively-doped semiconductive material, for example as shown in FIG. 7 with respect to a blanketing region composed of region 13. A mask comprising walls 38 is used while etching through blanketing region 13 to form inner region lines 43, for example as shown in FIG. 8. In one embodiment and as shown, pillars 33 are formed before forming metal lines 45. In one embodiment and as shown, the forming of metal lines 45 comprises depositing metal 44 thereof into void space between inner region lines 43 resulting from the etching, for example as shown by FIGS. 9 and 10.

In one embodiment, pillars 33 are formed to comprise three alternately doped, vertically superposed semiconductor material regions, and wherein the gated devices formed are transistors (e.g. a construction like that shown in FIG. 1). In one embodiment, pillars 33 are formed to comprise four alternately doped, vertically superposed semiconductor material regions, and wherein the gated devices are thyristors (e.g., a construction like that shown in FIG. 2).

In one embodiment, metal lines 45 may be electrically coupled to one another, for example proximate their respective ends (not shown). In one embodiment, inner regions 13 of the different gated devices may be electrically coupled to one another throughout an array, for example electrically coupling lines 43 proximate their respective ends (not shown). In one embodiment in a finished circuitry construction and in operation, metal lines 45 may be electrically coupled (i.e., separately, in groups, or collectively) to a suitable potential (i.e., voltage) to at least reduce parasitic capacitance and/or cross-talk between immediately adjacent of the gated devices. As an alternate example, the potential of metal lines 45 may be allowed to "float" whereby metal lines 45 (if electrically coupled to one another) electrically couple inner regions 13 of different gated devices to one another. In one embodiment, the inner region lines are electrically coupled to one another by other than the metal lines that are directly against and electrically coupled to sidewalls of the inner region lines (i.e., in addition to the metal lines if allowed to float or in lieu of the metal lines if not allowed to float).

Figure 16:
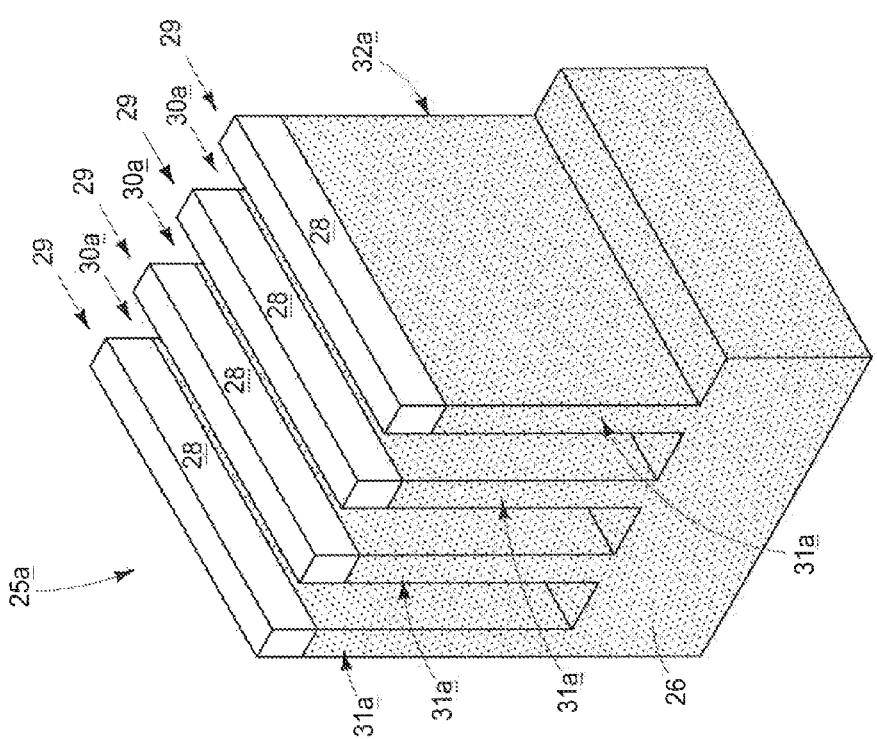

A second example embodiment of a method of forming an array of gated devices in accordance with the invention is described with reference to FIGS. 16-23 with respect to a substrate fragment 25a. Like numerals from the above-described embodiments have been used where appropriate, with some construction differences being indicated with the suffix "a" or with different numerals. FIG. 16 shows processing analogous to that shown by FIG. 3 and wherein trenches 30a have been formed to extend elevationally deeper into material 26 than trenches 30 in FIG. 3.

Figure 17:
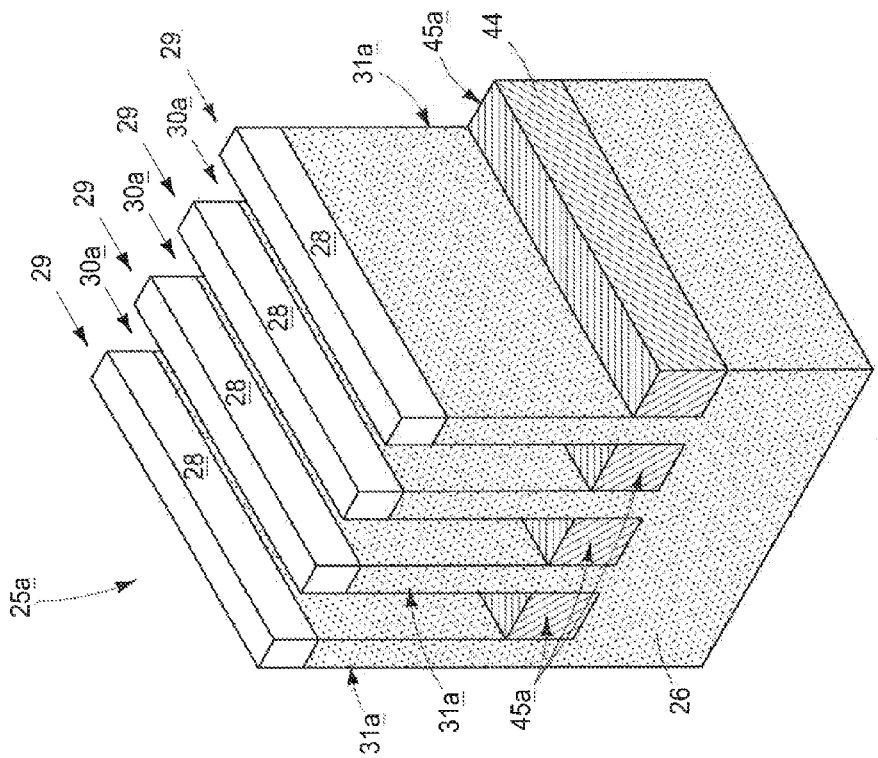

Referring to FIG. 17, metal lines 45a have been formed within the bottoms of trenches 30a between walls 31a, with metal lines 45a in this embodiment thereby longitudinally extending along columns 29.

Figure 18:
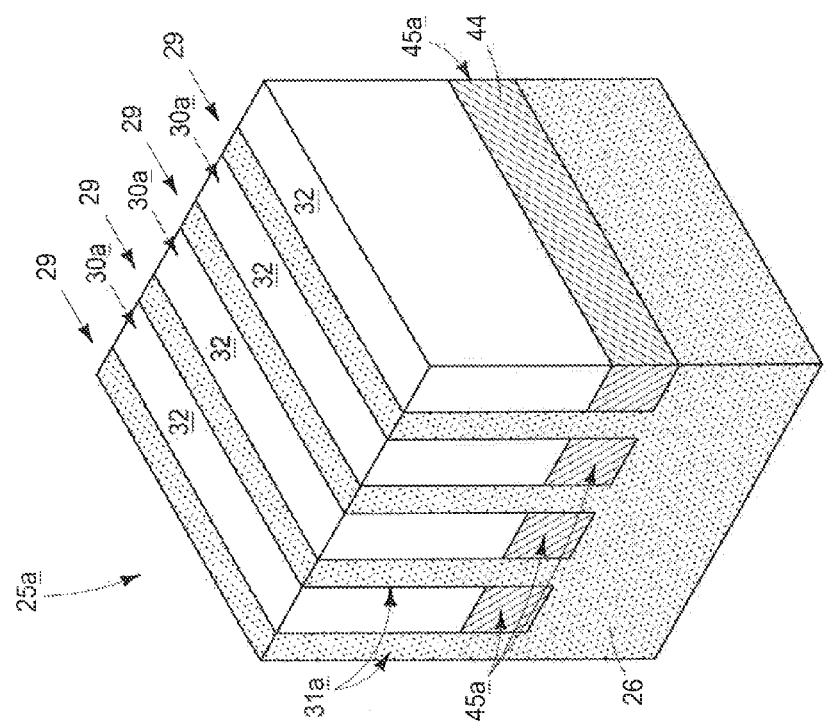

Referring to FIG. 18, dielectric material 32 has been deposited to fill remaining volume of trenches 30a, followed by planarization back through masking material 28 (not shown) to expose semiconductor material 26.

Figure 19:
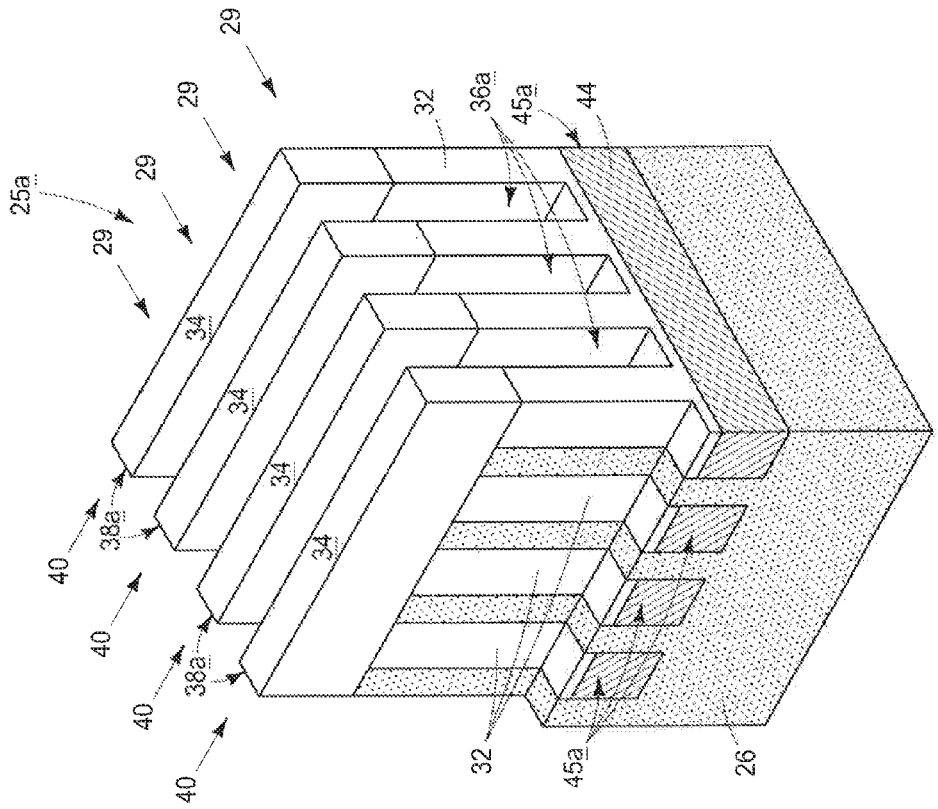

Referring to FIG. 19, masking material 34 has been deposited and patterned along rows 40, followed by etching into dielectric material 32 and material 26 to form walls 38a and trenches 36a. FIG. 19 shows only partial etching into dielectric material 32, although complete etching therethrough may alternately be conducted whereby the bases of trenches 36a are not composed of material 32.

Figure 20:
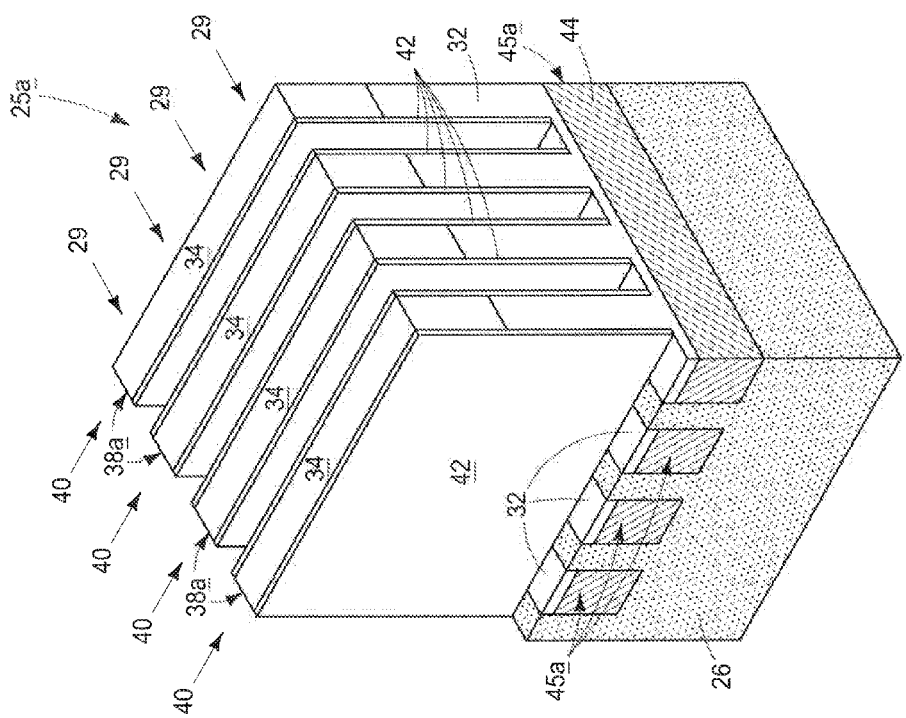

Referring to FIG. 20, dielectric material 42 has been formed over walls 38a, followed by anisotropic etching to remove material 42 from being substantially over horizontal surfaces.

Figure 21:
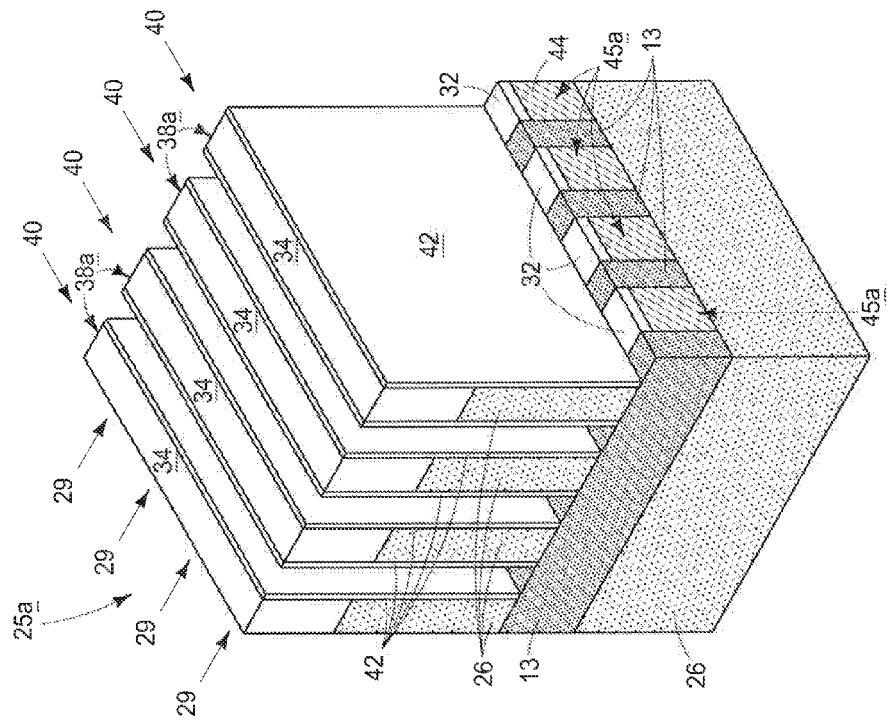

Referring to FIG. 21, substrate 25a has been rotated 90° counterclockwise relative to the substrate orientation in FIG. 20. Ion implantation and diffusion have been conducted into material 26 thereby forming inner regions 13.

Referring to FIG. 22, anisotropic etching has been conducted through material of inner regions 13 and exposed dielectric material 32 has been removed from over metal lines 45a. Pillars 33a have thereby been formed. Accordingly in this example embodiment, individual pillars 33a are formed to comprise inner regions 13 of individual gated devices. FIGS. 16-22 also show an example embodiment wherein the pillars are formed after forming metal lines 45*a* (e.g., as in FIGS. 19 and 22 in combination), and as well form an uppermost portion of the pillars (e.g., FIG. 19) separately and before forming a lowermost portion of the pillars (e.g., FIG. 22). Additionally, FIG. 22 shows an embodiment wherein metal lines 45*a* orthogonal columns 29 are formed to be laterally wider than pillars 33*a*.

Referring to FIG. 23, subsequent processing has occurred analogously to that described above with respect to FIGS. 13-15 whereby access lines 18 and data/sense lines 50 have been formed.

In one embodiment, inner regions 13 are electrically coupled to one another elevationally inward of metal lines 45*a*. For example, a blanketing heavily-doped diffusion region (not shown) may be formed (e.g., by ion implantation) elevationally inward of and directly against the bottoms of pillars 33*a*, thereby being electrically coupled to inner regions 13. As an alternate example, conductive lines (not shown) may be formed elevationally inward of and directly against the bottoms of pillars 33*a* and be electrically coupled to one another proximate their respective ends.

Other attribute(s) or construction(s) as described above may be used.

Figure 24:
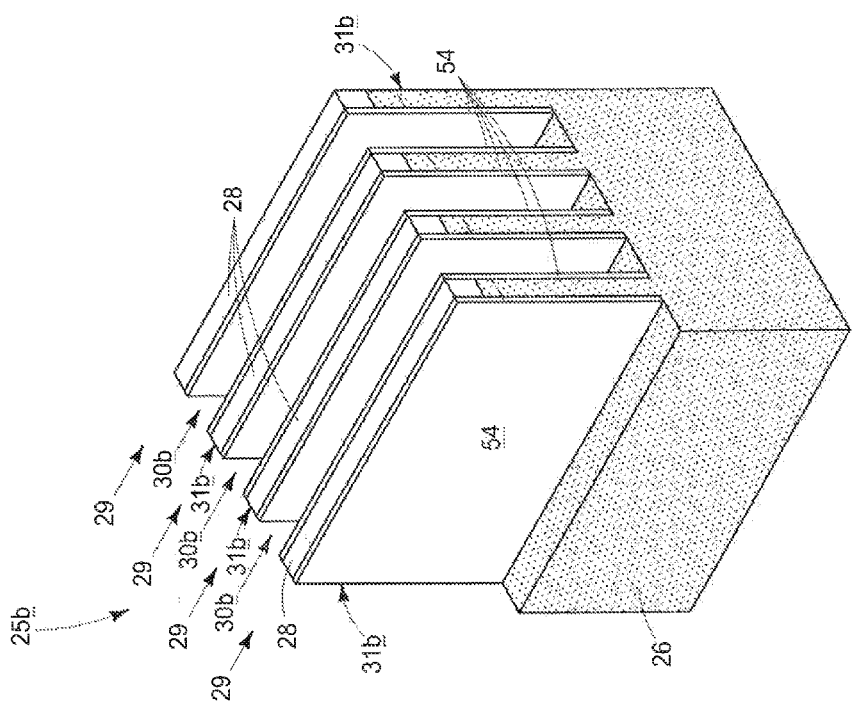

A third embodiment method of forming an array of gated devices in accordance with the invention is next described with reference to FIGS. 24-36 with respect to a substrate fragment 25*b*. Like numerals from the above-described embodiments have been used where appropriate, with some construction differences being indicated by the suffix "b" or with different numerals. Referring to FIG. 24, trenches 30*b* have been formed between walls 31*b* that longitudinally extend along one of the rows or the columns, with FIG. 24 showing the trenches and walls longitudinally extending along columns 29. Walls 31*b* comprise dielectric coverings 28 and 54 (e.g., silicon nitride).

Figure 25:
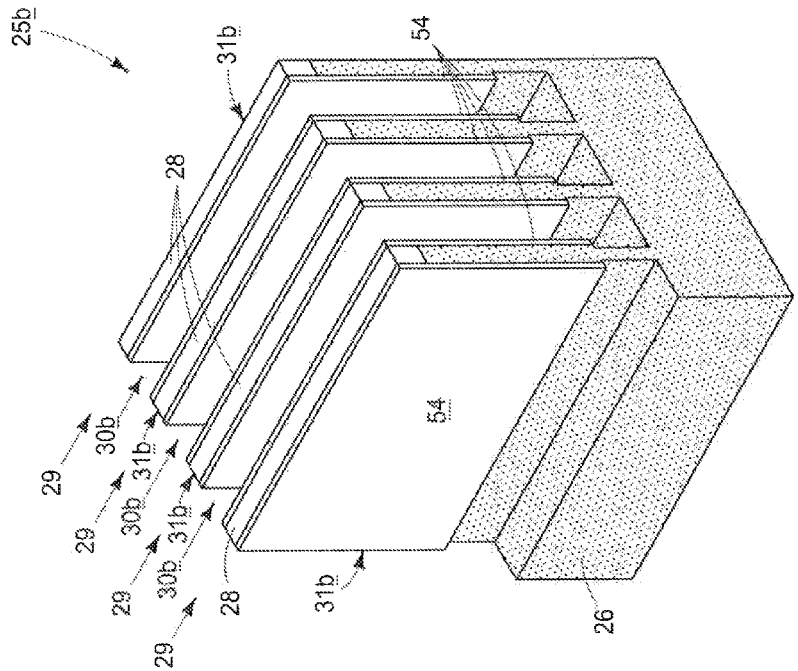

Referring to FIG. 25, trenches 30*b* have been extended deeper into semiconductor material 26. In one embodiment and as shown, an etch or etches to do so may be conducted with a degree of isotropy whereby the bottoms of trenches 30*b* are widened in comparison to elevationally outermost portions of trenches 30*b*.

Figure 26:
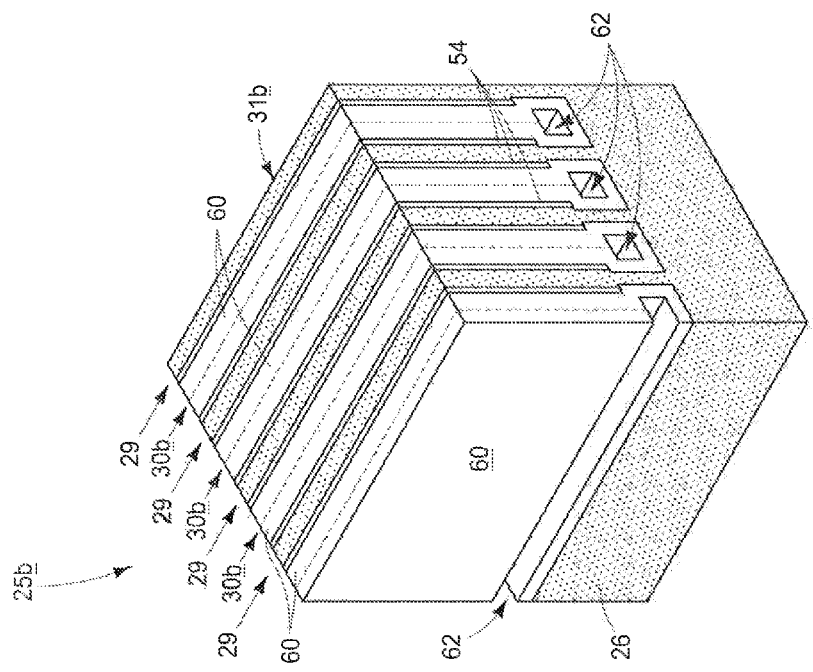

Referring to FIG. 26, placeholder material 60 (e.g., silicon dioxide) has been deposited within extended trenches 30*b*. Materials 60 and 54 have been planarized back through material 28 (not shown) to expose semiconductor material 26. In one embodiment and in part because of the widened bottoms of trenches 30*b*, placeholder material 60 may be formed in a CVD or other manner whereby longitudinally extending void spaces 62 are formed in the bottom of trenches 30*b*.

Figure 27:
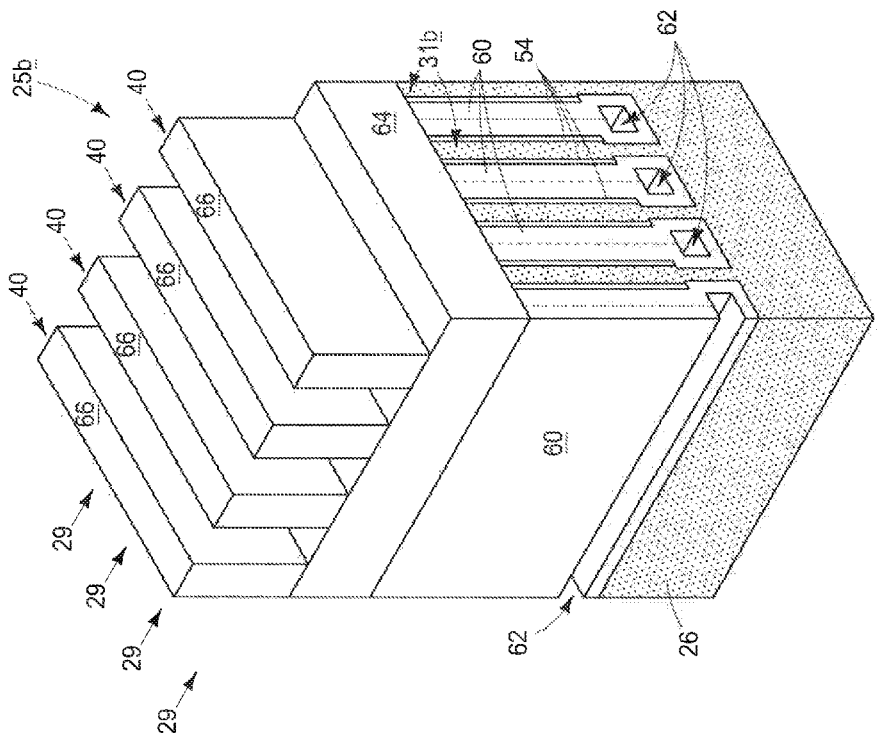

Referring to FIG. 27, dielectric material 64 (e.g., silicon nitride) has been deposited, followed by depositing and patterning of a masking material 66 (e.g., photoresist and/or carbon) along rows 40.

Figure 28:
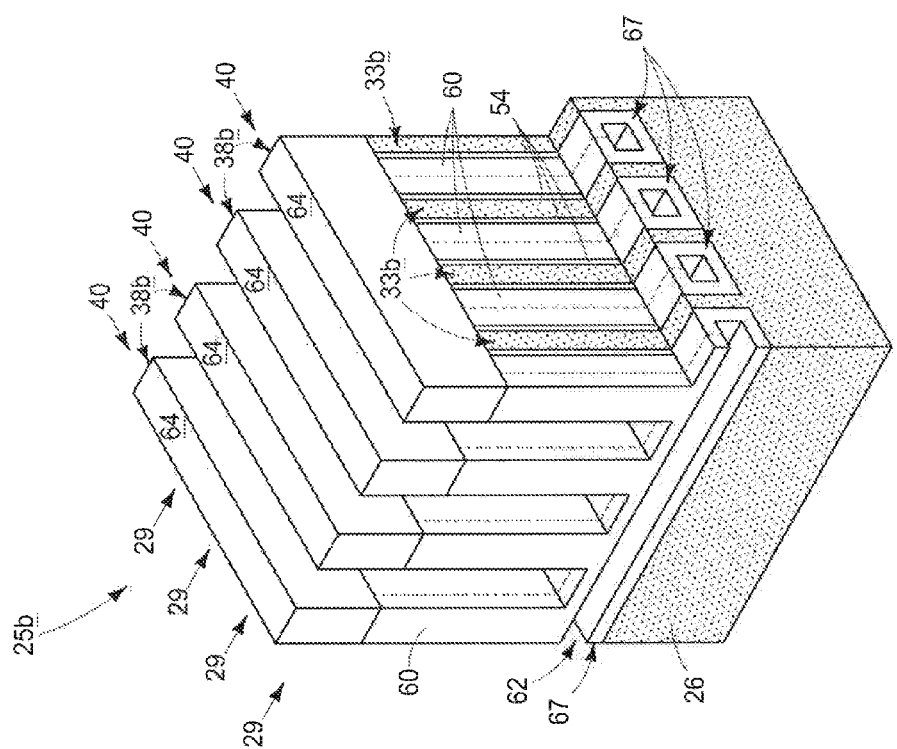

Referring to FIG. 28, the various materials have been anisotropically etched at least in part using masking material 66 (not shown) as a mask and ideally in a manner which does not openly expose longitudinally extending void spaces 62 at this point, and masking material 66 has been removed.

FIGS. 24-28 show but one example embodiment of forming placeholder material-lines 67 within bottoms of trenches 30*b* between walls 31*b* that longitudinally extend along one of rows or columns, with such trenches and walls being shown as extending along columns 29. Walls 38*b* have been patterned along the other of the rows or columns (e.g., rows 40 in the depicted example) to form spaced pillars 33*b* (FIG. 28).

Figure 29:
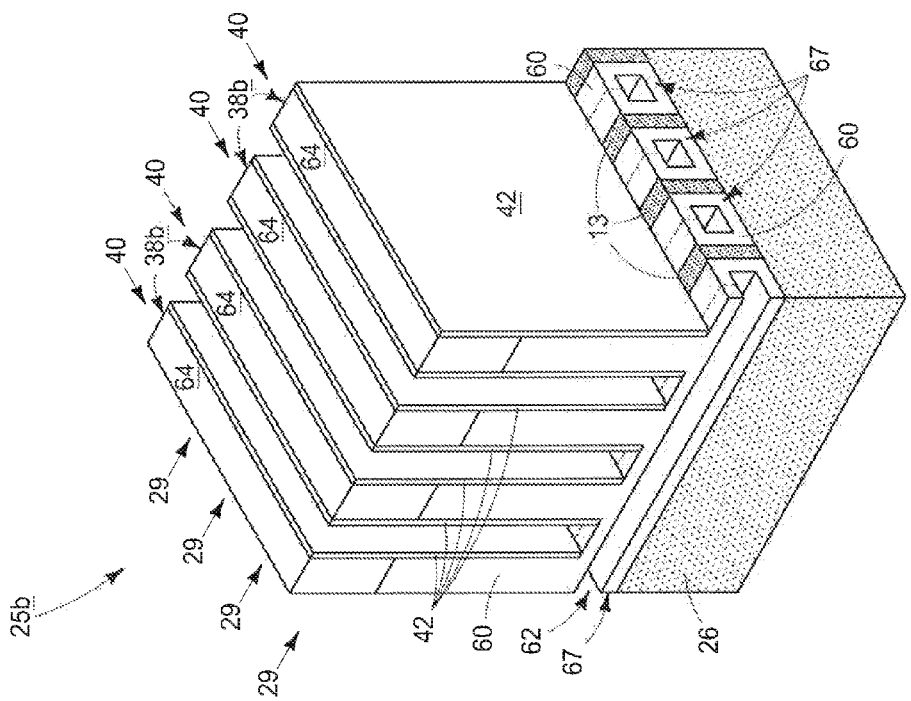

Referring to FIG. 29, dielectric material 42 has been formed to line sidewall surfaces of walls 38*b*, and suitable implanting and diffusion have been subsequently conducted to form inner regions 13. Other portions of pillars 33*b* (e.g., the elevationally mid and outer regions, with pillars 33*b* not being viewable in FIG. 29) may be implanted at this time also (not shown).

Figure 30:
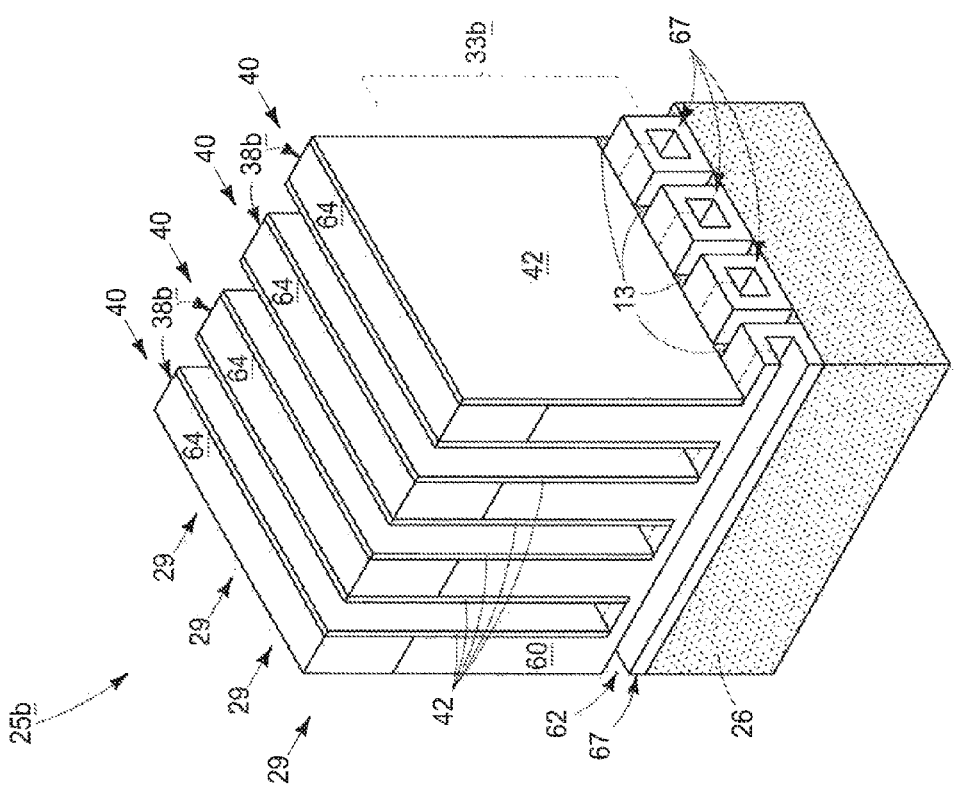

Referring to FIG. 30, walls 38*b* have been used as a mask while etching through material of inner regions 13 to individually complete formation of spaced pillars 33*b* to individually comprise inner region 13, the mid region (not viewable in FIG. 30), and the outer region (not viewable in FIG. 30) of individual of the gated devices. Individual inner regions 13 are formed to comprise a pillar that is spaced from pillars of other inner regions in a horizontal cross-section, for example with regions 13 being so-spaced as shown through any horizontal cross-section taken elevationally between the bottoms of material 42 and the bases of lines 67.

Figure 31:
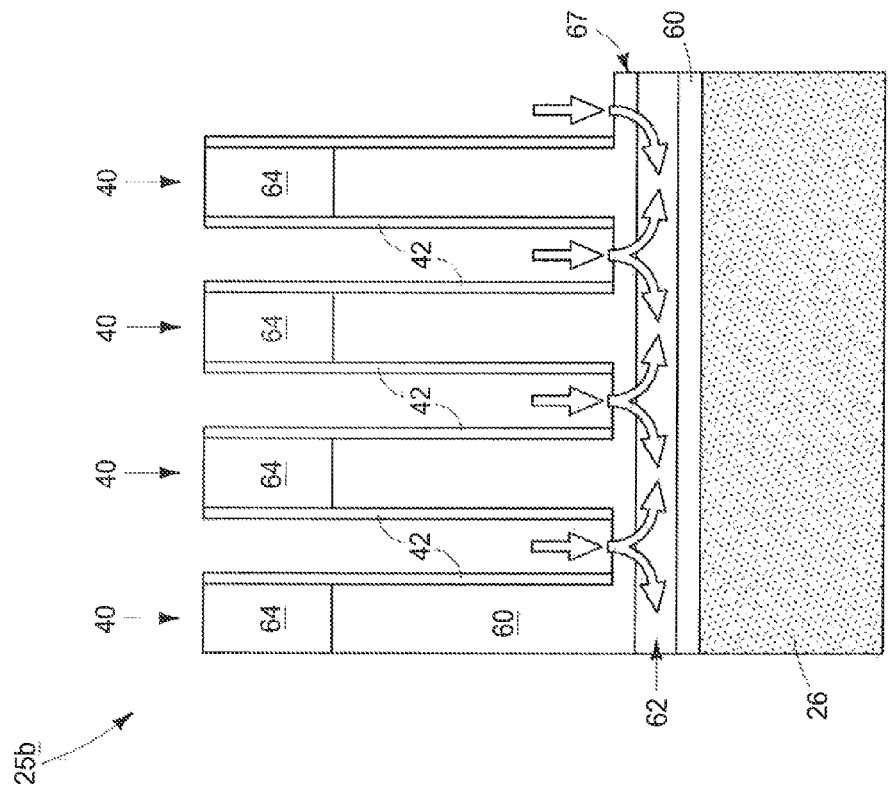
FIG. 31 is a left front view of FIG. 30 showing processing occurring to the substrate of FIG. 30 to produce the structure of FIGS. 32 and 33.
Figure 33:
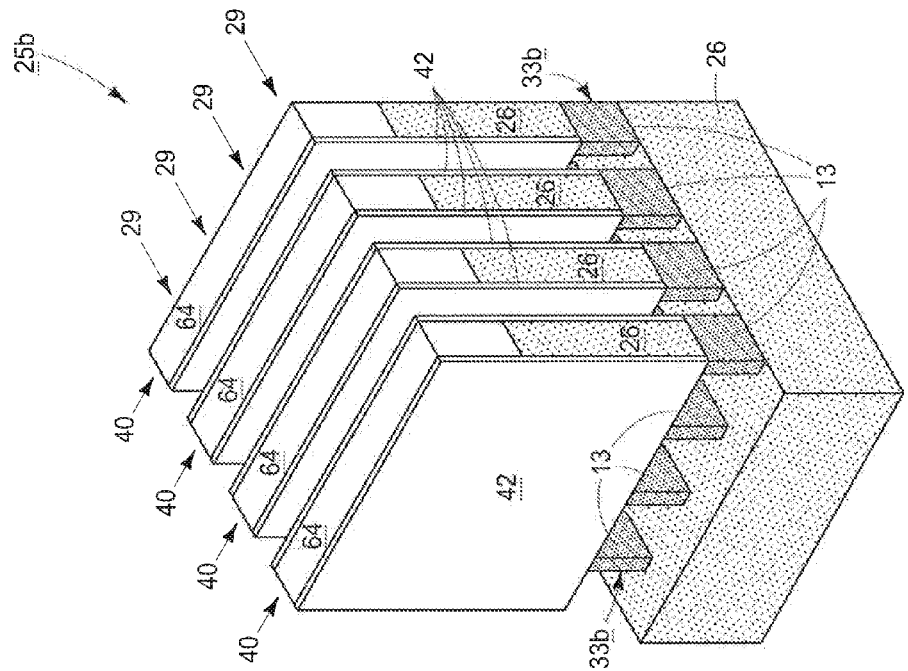
Figure 32:
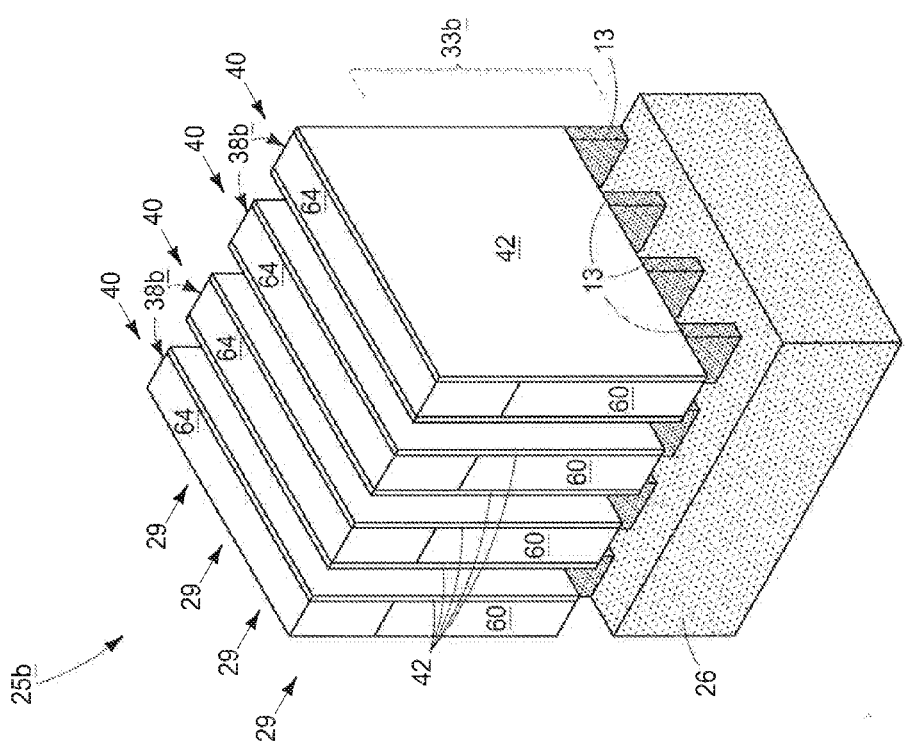

Referring to FIGS. 31-33, substrate 25*b* in FIG. 33 has been rotated 90° clockwise relative to the substrate orientation in FIG. 32. Placeholder material-lines 67 (shown in FIG. 31, but not in FIGS. 32 and 33) have been removed. Such exposes sidewalls of inner regions 13 of pillars 33*b* along the one of the rows or columns, with such being along columns 29 in the depicted example as sidewalls of inner regions 13 were otherwise exposed along rows 40 in the processing shown by FIG. 30. In one embodiment, removal of lines 67 may occur by wet isotropic etching intended to be depicted by the large arrows in FIG. 31. Formation of longitudinally extending void spaces 62 in placeholder material-lines 67 may facilitate removal and shorter etching of placeholder material 60 from below material 42 while leaving placeholder material 60 elevationally outward of inner regions 13 as shown (FIG. 32).

Referring to FIGS. 34 and 35, metal 44 has been deposited to be circumferentially surrounding, directly against, and electrically coupled to the sidewalls of inner regions 13 of pillars 33*b*. Such may be performed by a highly conformal chemical vapor deposition and/or atomic layer deposition of metal 44, followed by etch-back to produce the FIGS. 34 and 35 structure.

Figure 36:
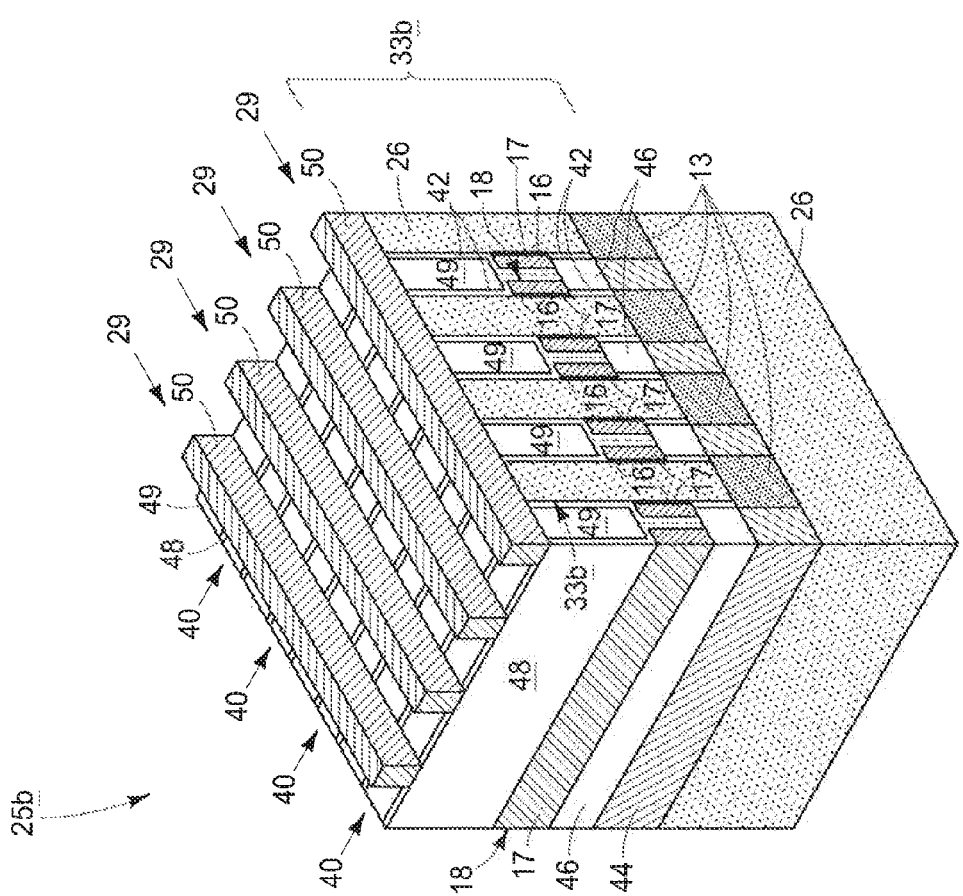

Referring to FIG. 36, subsequent processing has been conducted analogously to that described above whereby a plurality of access lines 18 and a plurality of data/sense lines 50 have been formed. Metal 44 is electrically isolated from data/sense lines 50. In one embodiment, inner regions 13 (not viewable in FIG. 36) may be electrically coupled to one another elevationally inward of metal 44.

Other attribute(s) or construction(s) as described above may be used.

Figure 37:
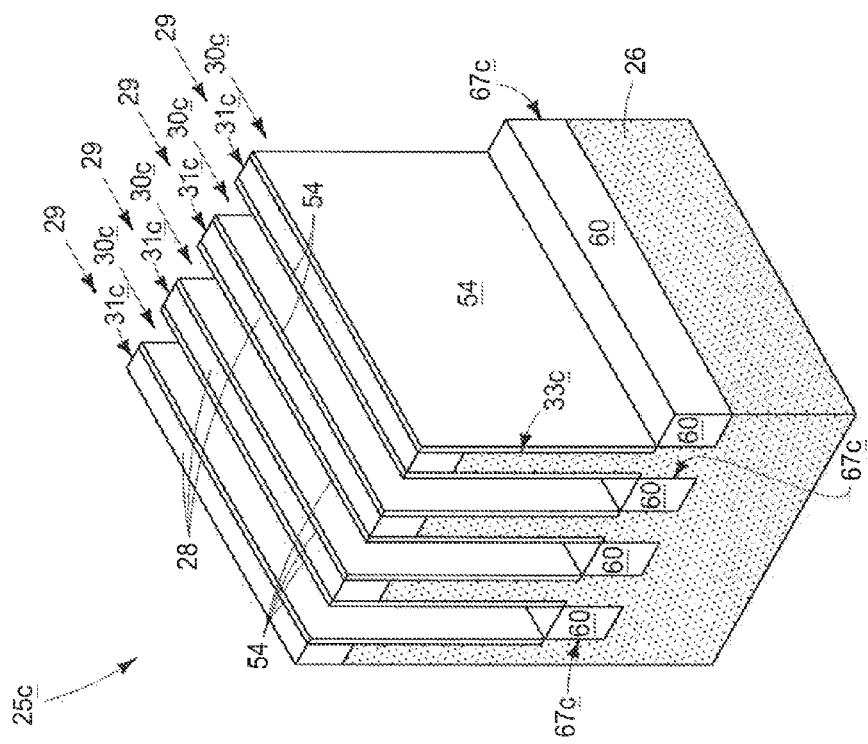

A fourth example method of forming an array of gated devices in according with embodiments of the invention is next described with reference to FIGS. 37-44 with respect to a substrate fragment 25*c*. Like numerals from the above-described embodiments have been used where appropriate, with some construction differences being indicated with the suffix "c" or with different numerals. FIG. 37 is similar to FIG. 25, but wherein subsequent etching has been conducted to deepen trenches 30*c* into semiconductor material 26 without widening the bottoms thereof. Placeholder material 60 and lines 67*c* thereof have been formed within the bottoms of trenches 30*c* between walls 31*c* that longitudinally extend along one of the rows or columns, with such extending along columns 29 in the depicted example.

Figure 38:
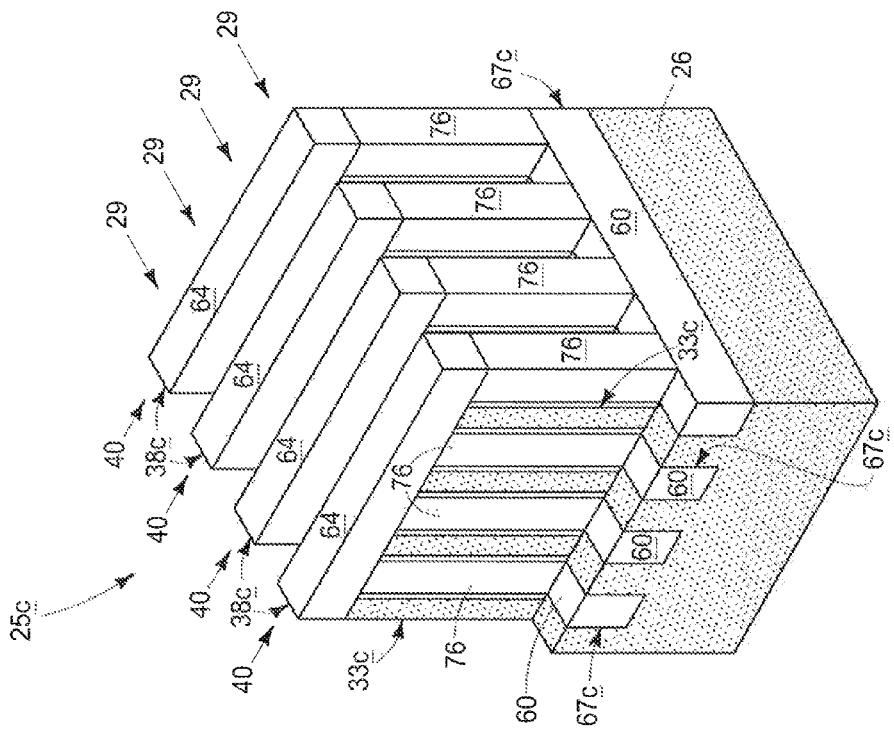
FIGS. 37-42 and 44 are diagrammatic sequential isometric views of a substrate in process in accordance with some embodiments of the invention.

Referring to FIG. 38, subsequent processing has occurred analogous to that described above whereby a dielectric material 76 (e.g., silicon nitride) has been deposited and walls 31c of FIG. 37 have been patterned along rows 40 to form walls 38c and spaced pillars 33c.

Figure 40:
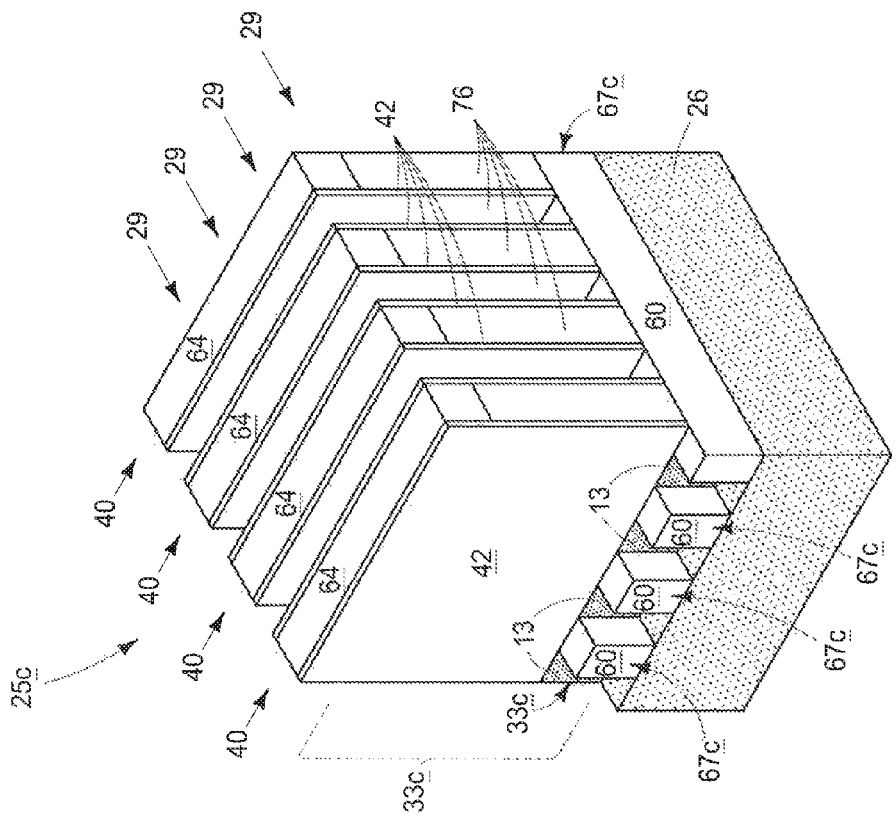
Figure 39:
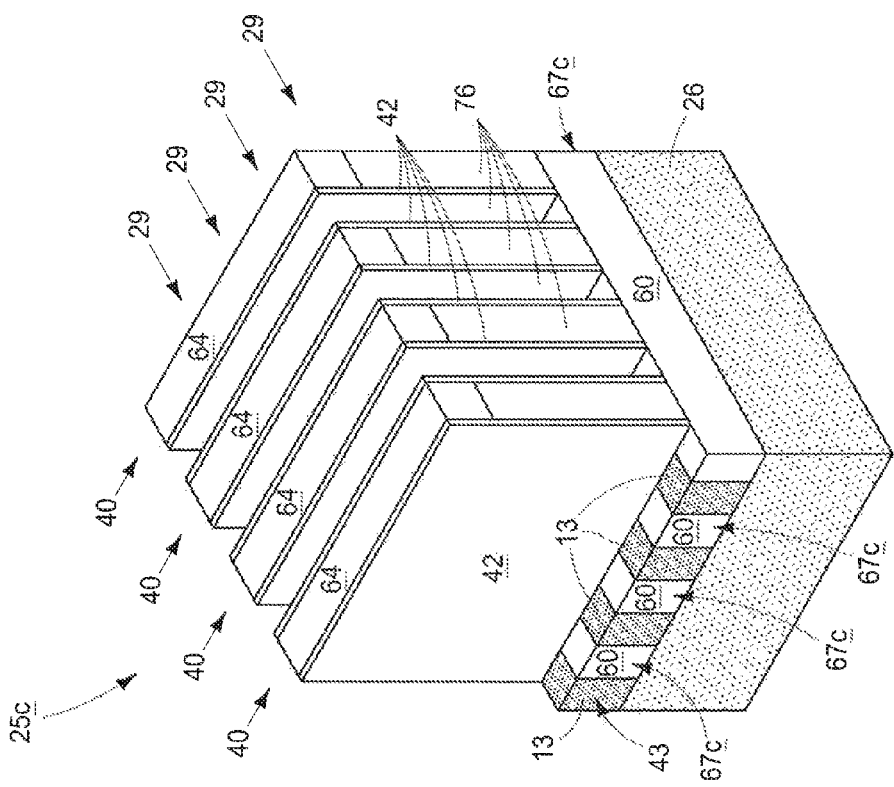

FIGS. 39 and 40 show subsequent processing analogous to that described above with respect to FIGS. 29 and 30, respectively.

Figure 41:
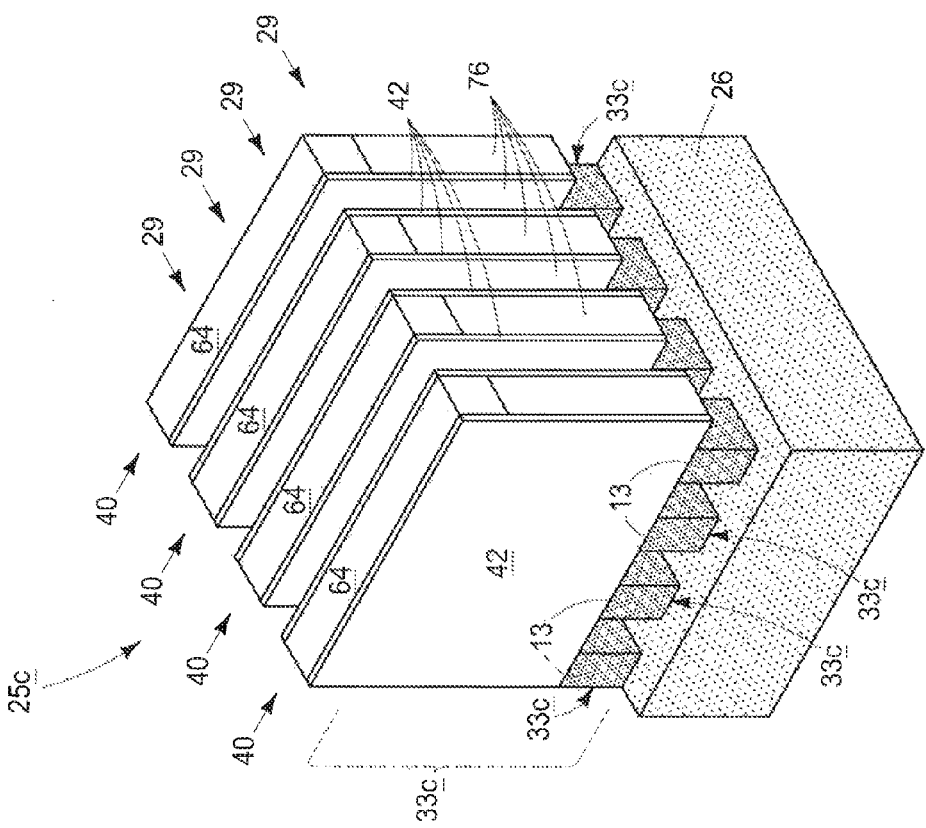

Referring to FIG. 41, placeholder material-lines 67c (not shown) have been removed to expose sidewalls of inner regions 13 along columns 29.

Figure 42:
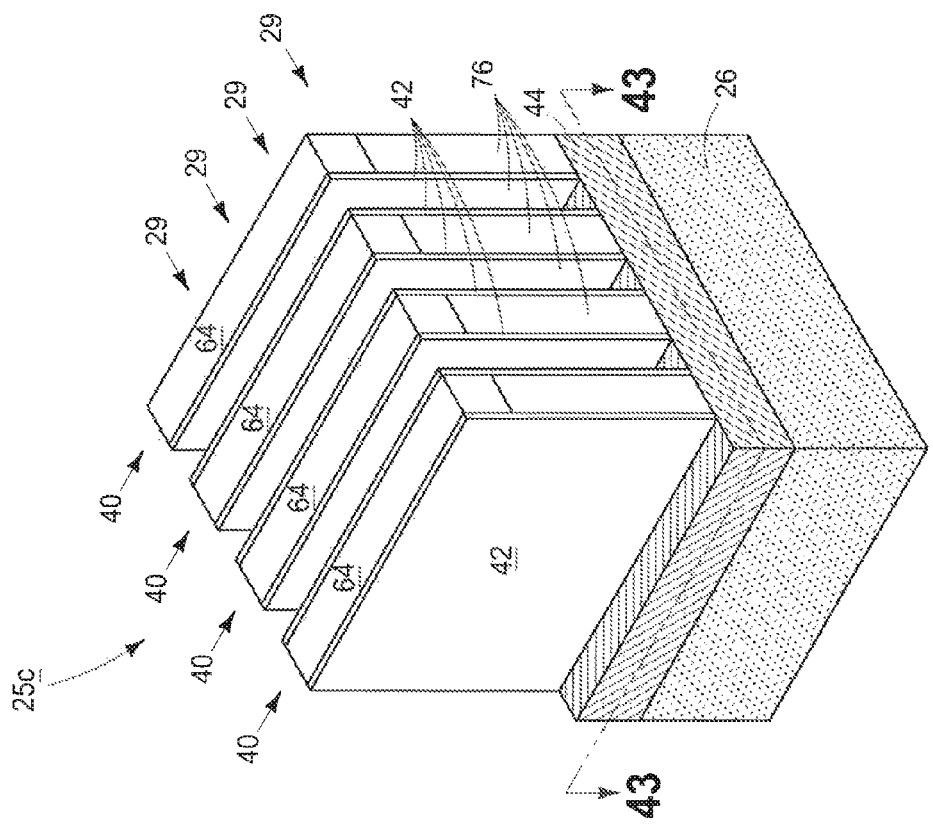
Figure 43:
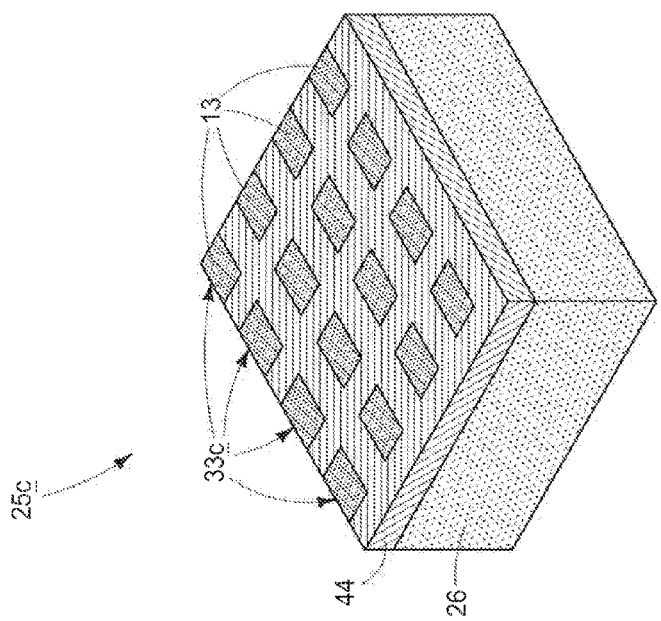
FIG. 43 is an isometric sectional view through line 43-43 in FIG. 42.

Referring to FIGS. 42 and 43, metal 44 has been deposited to be circumferentially surrounding, directly against, and electrically coupled to the sidewalls of inner regions 13 of pillars 33c (FIG. 43).

Figure 44:
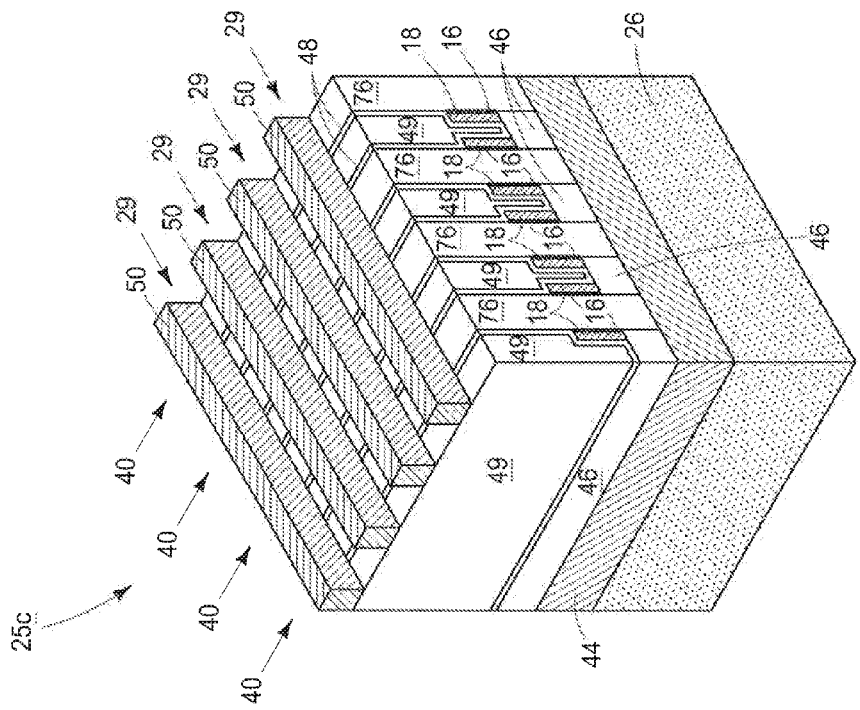

Referring to FIG. 44, processing has occurred analogously to that described above whereby access lines 18 and data/sense lines 50 have been formed.

Other attribute(s) or construction(s) as described above may be used.

Embodiments of the invention encompass arrays of gated devices independent of method of manufacture. In one embodiment, such an array comprises a plurality of gated devices (e.g., construction 10 and/or construction 20) arranged in rows 40 and columns 29 and individually comprising an elevationally inner region 13, a mid region 14 elevationally outward of inner region 13, and an elevationally outer region 15 or 22 elevationally outward of mid region 14. The array includes a plurality of access lines 18 that individually are operatively laterally proximate mid regions 14 along individual of rows 40. The array includes a plurality of data/sense lines 50 that individually are elevationally outward of access lines 18 and electrically coupled to outer regions 15 or 22 along individual of columns 29. The array includes a plurality of metal lines 45 that individually longitudinally extend along and between immediately adjacent of rows 40 elevationally inward of access lines 18. Individual metal lines 45 are directly against and electrically coupled to sidewalls of inner regions 13 of each of immediately adjacent of rows 40. Metal lines 45 are electrically isolated from data/sense lines 50. In one embodiment, the gated devices individually comprise a pillar 33 comprising mid region 14 and outer region 15. In one embodiment, inner regions 13 extend in lines 43 that longitudinally run between immediately adjacent metal lines 45 and under and between pillars 33. In one such embodiment, metal lines 45 are laterally narrower than inner region lines 43 orthogonal rows 40. In one embodiment, metal lines 45 are electrically coupled to a suitable potential to at least reduce parasitic capacitance and/or cross-talk between immediately adjacent of the gated devices. In one embodiment, inner regions 13 of different gated devices are electrically coupled to one another by other than the metal lines that are directly against and electrically coupled to sidewalls of the inner region lines. Other attribute(s) or construction(s) as described above may be used.

In one embodiment, an array of gated devices includes a plurality of metal lines 45a that individually longitudinally extend along and between immediately adjacent of columns 29 elevationally inward of access lines 18. Individual metal lines 45a are directly against and electrically coupled to sidewalls of inner regions 13 of each immediately adjacent of columns 29. Metal lines 45a are electrically isolated from data/sense lines 50. In one embodiment, the gated devices individually comprise a pillar 33a comprising inner region 13, mid region 14, and outer region 15. In one embodiment, orthogonal columns 29, metal lines 45a are laterally wider than pillars 33a. In one embodiment, inner regions 13 of pillars 33a are electrically coupled to one another elevationally inward of metal lines 45a, the inner regions thereby being electrically coupled to one another by other than, and/or not solely by, the metal lines that are directly against and electrically coupled to sidewalls of the inner regions of the pillars. Other attribute(s) or construction(s) as described above may be used.

In one embodiment in an array of gated devices, individual of inner regions 13 comprise a pillar 33b/33c that is spaced from the pillars of other inner regions in a horizontal cross-section. Metal 44 circumferentially surrounds, is directly against, and is electrically coupled to sidewalls of inner regions 13 of pillars 33b/33c. Metal 44 is electrically isolated from data/sense lines 50. Inner regions 13 are electrically coupled to one another elevationally inward of metal 44. In one embodiment, inner regions 13 are electrically coupled to one another elevationally inward of metal 44, thereby being electrically coupled to one another by other than, and/or not solely by, the metal that is directly against the sidewalls of the inner regions of the pillars. Other attribute(s) or construction(s) as described above may be used.

CONCLUSION

In some embodiments, a method includes forming an array of gated devices, with the gated devices being arranged in rows and columns and comprising an elevationally inner region, a mid region elevationally outward of the inner region, and an elevationally outer region elevationally outward of the mid region. Metal lines are formed within bottoms of trenches between walls that longitudinally extend along one of rows or columns. Pillars are formed to individually comprise the mid region and the outer region of individual gated devices. A plurality of access lines is formed elevationally outward of the metal lines and that individually are laterally proximate the mid regions along individual of the rows. A plurality of data/sense lines is formed and that individually are elevationally outward of the access lines and electrically coupled to the outer regions along individual of the columns. The metal lines are formed to individually longitudinally extend along and between immediately adjacent the one of the rows or columns and be directly against and electrically coupled to sidewalls of the inner regions of each of immediately adjacent of the rows or columns. The metal lines are electrically isolated from the data/sense lines.

In some embodiments, a method includes forming an array of gated devices, with the gated devices being arranged in rows and columns and comprising an elevationally inner region, a mid region elevationally outward of the inner region, and an elevationally outer region elevationally outward of the mid region. Individual of the inner regions comprise a pillar that is spaced from the pillars of other inner regions in a horizontal cross section. Placeholder material-lines are formed within bottoms of trenches between walls that longitudinally extend along one of rows or columns. The walls are patterned along the other of the rows or columns to form spaced pillars to individually comprise the inner region, the mid region, and the outer region of individual of the gated devices. After the patterning, the placeholder material-lines are removed to expose sidewalls of the inner regions of the pillars along the one of the rows or columns. After the removing, metal is deposited to be circumferentially surrounding, directly against, and electrically coupled to the sidewalls of the inner regions of the pillars. A plurality of access lines is formed elevationally outward of the metal and that individually are laterally proximate the mid regions along individual of the rows. A plurality of data/sense lines is formed and that individually are elevationally outward of the access lines and electrically coupled to the outer regions along individual of the columns. The metal is electrically isolated from the data/sense lines.

In some embodiments, an array of gated devices comprises a plurality of gated devices arranged in rows and columns and individually comprising an elevationally inner region, a mid region elevationally outward of the inner region, and an elevationally outer region elevationally outward of the mid region. A plurality of access lines are individually laterally proximate the mid regions along individual of the rows. A plurality of data/sense lines are individually elevationally outward of the access lines and electrically coupled to the outer regions along individual of the columns. A plurality of metal lines extend individually longitudinally along and between immediately adjacent of the rows elevationally inward of the access lines. The individual metal lines are directly against and electrically coupled to sidewalls of the inner regions of each of immediately adjacent of the rows. The metal lines are electrically isolated from the data/sense lines.

In some embodiments, an array of gated devices comprises a plurality of gated devices arranged in rows and columns and individually comprising an elevationally inner region, a mid region elevationally outward of the inner region, and an elevationally outer region elevationally outward of the mid region. A plurality of access lines are individually laterally proximate the mid regions along individual of the rows. A plurality of data/sense lines are individually elevationally outward of the access lines and electrically coupled to the outer regions along individual of the columns. A plurality of metal lines extend individually longitudinally along and between immediately adjacent of the columns elevationally inward of the access lines. The individual metal lines are directly against and electrically coupled to sidewalls of the inner regions of each of immediately adjacent of the columns. The metal lines are electrically isolated from the data/sense lines.

In some embodiments, an array of gated devices comprises a plurality of gated devices arranged in rows and columns and individually comprising an elevationally inner region, a mid region elevationally outward of the inner region, and an elevationally outer region elevationally outward of the mid region. Individual of the inner regions comprise a pillar that is spaced from the pillars of other inner regions in a horizontal cross section. A plurality of access lines are individually laterally proximate the mid regions along individual of the rows. A plurality of data/sense lines are individually elevationally outward of the access lines and electrically coupled to the outer regions along individual of the columns. Metal circumferentially surrounds, is directly against, and is electrically coupled to sidewalls of the inner regions of the pillars. The metal is electrically isolated from the data/sense lines.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of forming an array of gated devices, the gated devices being arranged in rows and columns and comprising an elevationally inner region, a mid region elevationally outward of the inner region, and an elevationally outer region elevationally outward of the mid region, the method comprising:
    forming metal lines within bottoms of trenches between walls that longitudinally extend along one of rows or columns;
    forming pillars individually to comprise the mid region and the outer region of individual gated devices;
    forming a plurality of access lines elevationally outward of the metal lines and that individually are laterally proximate the mid regions along individual of the rows;
    forming a plurality of data/sense lines that individually are elevationally outward of the access lines and electrically coupled to the outer regions along individual of the columns; and
    the metal lines being formed to individually longitudinally extend along and between immediately adjacent the one of the rows or columns and being directly against and electrically coupled to sidewalls of the inner regions of each of immediately adjacent of the rows or columns, the metal lines being electrically isolated from the data/sense lines, the metal lines being formed to the same total vertical thickness as that of the inner regions, the metal lines and the inner regions having respective longitudinally-elongated-uppermost surfaces that are elevationally coincident, the metal lines and the inner regions having respective longitudinally-elongated-lowermost surfaces that are elevationally coincident, the inner regions comprising doped semiconductor material that is directly against sidewalls of immediately-adjacent of the metal lines from their respective longitudinally-elongated-lowermost surfaces to their respective longitudinally-elongated-uppermost surfaces.

2. The method of claim 1 wherein the walls and the metal lines longitudinally extend along the rows.

3. The method of claim 1 wherein the walls and the metal lines longitudinally extend along the columns.

4. The method of claim 1 comprising forming the pillars before forming the metal lines.

5. The method of claim 1 comprising forming the pillars after forming the metal lines.

6. The method of claim 5 comprising forming an uppermost portion of the pillars separately and before forming a lowermost portion of the pillars.

7. The method of claim 1 comprising forming the individual pillars to comprise the inner regions of individual gated devices.

8. The method of claim 7 wherein the inner regions of the pillars are electrically coupled to one another elevationally inward of the metal lines, the inner regions thereby being electrically coupled to one another by other than, and/or not solely by, the metal lines that are directly against and electrically coupled to sidewalls of the inner regions of the pillars.

9. The method of claim 7 wherein,
    the walls and the metal lines longitudinally extend along the columns; and
    the metal lines, orthogonal the columns, are formed to be laterally wider than the pillars.

10. The method of claim 1 comprising forming the inner regions in lines that longitudinally run between immediately adjacent of the metal lines and under and between the pillars.

11. The method of claim 10 wherein the inner region lines are electrically coupled to one another by other than, and/or not solely by, the metal lines that are directly against and electrically coupled to sidewalls of the inner region lines.

12. The method of claim 10 wherein the metal lines and inner region lines longitudinally extend along the rows.

13. The method of claim 12 wherein the metal lines are formed to be laterally narrower than the inner region lines.

14. The method of claim 10 wherein forming the inner regions in lines comprises:
forming a blanketing region of conductively-doped semiconductive material; and
using a mask comprising the walls while etching through the blanketing region to form the inner region lines.

15. The method of claim 14 comprising forming the pillars before forming the metal lines.

16. The method of clam 1 wherein the respective longitudinally-elongated-uppermost surfaces of the metal lines and the inner regions are planar and coplanar.

17. The method of clam 1 wherein the respective longitudinally-elongated-lowermost surfaces of the metal lines and the inner regions are planar and coplanar.

18. A method of forming an array of gated devices, the gated devices being arranged in rows and columns and comprising an elevationally inner region, a mid region elevationally outward of the inner region, and an elevationally outer region elevationally outward of the mid region, the method comprising:
forming metal lines within bottoms of trenches between walls that longitudinally extend along one of rows or columns, the forming the metal lines comprising:
depositing metal of the metal lines to completely fill the trench bottoms and to line lateral surfaces of and less than fill an elevationally outermost region of the trenches; and
removing the metal that less than fills the elevationally outermost region of the trenches and leaving the metal completely filling across the bottoms of the trenches;
forming pillars individually to comprise the mid region and the outer region of individual gated devices;
forming a plurality of access lines elevationally outward of the metal lines and that individually are laterally proximate the mid regions along individual of the rows;
forming a plurality of data/sense lines that individually are elevationally outward of the access lines and electrically coupled to the outer regions along individual of the columns; and
the metal lines being formed to individually longitudinally extend along and between immediately adjacent the one of the rows or columns and being directly against and electrically coupled to sidewalls of the inner regions of each of immediately adjacent of the rows or columns, the metal lines being electrically isolated from the data/sense lines.

19. A method of forming an array of gated devices, the gated devices being arranged in rows and columns and comprising an elevationally inner region, a mid region elevationally outward of the inner region, and an elevationally outer region elevationally outward of the mid region, the method comprising:
patterning semiconductor material in a column direction to form longitudinally continuous column walls of the semiconductor material having column trenches between the column walls;
forming dielectric material within the column trenches;
after forming the dielectric material, patterning the column walls and the dielectric material in the column trenches in a row direction to form longitudinally continuous row walls having row trenches between the row walls, the row walls comprising spaced pillars of the semiconductor material having pillars of the dielectric material there-between along the row direction, the pillars of semiconductor material ultimately being formed to individually comprise the mid region and the outer region of individual gated devices;
using the row walls as a mask while deepening the row trenches by removing the semiconductor material from bottoms of the row trenches and forming the inner regions in individual continuous lines that longitudinally run in the row direction under the pillars of semiconductor material and under the dielectric material pillars between the deepened row trenches;
forming metal row lines within bottoms of the deepened row trenches;
forming a plurality of access lines elevationally outward of the metal lines and that individually are laterally proximate the mid regions along individual of the rows;
forming a plurality of data/sense lines that individually are elevationally outward of the access lines and electrically coupled to the outer regions along individual of the columns; and
the metal lines being directly against and electrically coupled to sidewalls of the inner regions of each of immediately adjacent of the rows, the metal lines being electrically isolated from the data/sense lines.

20. The method of claim 19 comprising forming a dielectric material to cover side surfaces of the row walls prior to deepening the row trenches.

21. The method of claim 19 comprising conductively doping the semiconductor material at the bottoms of the trenches and beneath the pillars of semiconductor material and beneath the dielectric material pillars after forming the row walls and before deepening the row trenches.

22. A method of forming an array of gated devices, the gated devices being arranged in rows and columns and comprising an elevationally inner region, a mid region elevationally outward of the inner region, and an elevationally outer region elevationally outward of the mid region, the method comprising:
forming metal lines within bottoms of trenches between walls that longitudinally extend along the rows;
forming pillars individually to comprise the mid region and the outer region of individual gated devices;
forming a plurality of access lines elevationally outward of the metal lines and that individually are laterally proximate the mid regions along individual of the rows, pairs of immediately adjacent access lines being formed to individually laterally overlap an individual of the metal lines there-below in different respective vertical planes along the rows;
forming a plurality of data/sense lines that individually are elevationally outward of the access lines and electrically coupled to the outer regions along individual of the columns; and
the metal lines being formed to individually longitudinally extend along and between immediately adjacent of the rows and being directly against and electrically coupled to sidewalls of the inner regions of each of immediately adjacent of the rows, the metal lines being electrically isolated from the data/sense lines.

23. The method of claim 22 wherein the individual access lines in the pairs also laterally overlap immediately laterally adjacent of the inner regions in other different respective vertical planes along the rows.

* * * * *